US00RE41579E

(19) United States
(12) Reissued Patent
Miyake et al.

(10) Patent Number: US RE41,579 E
(45) Date of Reissued Patent: Aug. 24, 2010

(54) POSITIVE TYPE PHOTOSENSITIVE IMAGE-FORMING MATERIAL FOR USE WITH AN INFRARED LASER

(75) Inventors: Hideo Miyake, Shizuoka (JP); Ikuo Kawauchi, Shizuoka (JP)

(73) Assignee: FUJIFILM Corporation, Tokyo (JP)

(21) Appl. No.: 10/761,099
(22) Filed: Jan. 21, 2004

Related U.S. Patent Documents

Reissue of:
(64) Patent No.: 6,340,551
Issued: Jan. 22, 2002
Appl. No.: 09/421,535
Filed: Oct. 20, 1999

U.S. Applications:

(62) Division of application No. 09/173,719, filed on Oct. 16, 1998, now Pat. No. 6,573,022.

(30) Foreign Application Priority Data

Oct. 17, 1997 (JP) ..... 9-285754
Nov. 14, 1997 (JP) ..... 9-313778

(51) Int. Cl.
*G03C 1/52* (2006.01)
*G03F 7/00* (2006.01)
*G03F 7/004* (2006.01)

(52) U.S. Cl. ..... 430/192; 430/156; 430/270.1; 430/271.1; 430/273.1; 430/281.1; 430/905; 430/944

(58) Field of Classification Search ..... 430/271.1, 430/273.1, 156, 964, 192, 270.1, 281.1, 905, 430/944

See application file for complete search history.

(56) References Cited

U.S. PATENT DOCUMENTS 3,188,210 A 6/1965 Fritz et al.

(Continued)

FOREIGN PATENT DOCUMENTS

DE 2626769 1/1977

(Continued)

OTHER PUBLICATIONS

Database WPI, section Ch. week 9903, Derwent Publications Ltd. Abstract of Jp. 7–285275.*

(Continued)

*Primary Examiner*—Amanda C. Walke
(74) *Attorney, Agent, or Firm*—Sughrue Mion, PLLC

(57) ABSTRACT

A positive type photosensitive image-forming material for use with an infrared laser is provided. The material includes a substrate, a layer (A) containing not less than 50% by weight of a copolymer which contains, as a copolymerization component, not less than 10% by mol of at least one of the following monomers (a-1) to (a-3), wherein (a-1) is a monomer having in the molecule a sulfonamide group wherein at least one hydrogen atom is linked to a nitrogen atom, (a-2) is a monomer having in the molecule an active imino group represented by the following general formula (I):

(I)

and (a-3) is a monomer selected from acrylamide, methacrylamide, acrylate, methacrylate and hydroxystyrene, which respectively have a phenolic hydroxyl group; and a layer (B) containing not less than 50% by weight of an aqueous alkali solution-soluble resin having a phenolic hydroxyl group. The layer (A) and the layer (B) are laminated on the substrate in that order. At least the layer (B) contains a compound which generates heat upon absorbing light. The image-forming material has excellent stability of sensitivity with regard to concentration of a developing solution, i.e., has excellent development latitude.

120 Claims, 1 Drawing Sheet

U.S. PATENT DOCUMENTS

| | | | | | |
|---|---|---|---|---|---|
| 3,645,733 | A | | 2/1972 | Brinckman et al. | |
| 4,132,168 | A | * | 1/1979 | Peterson | 430/296 |
| 4,163,097 | A | | 7/1979 | Baumann et al. | |
| 4,308,368 | A | | 12/1981 | Kubo et al. | |
| 4,665,124 | A | | 5/1987 | Walls et al. | |
| 4,687,727 | A | | 8/1987 | Toyama et al. | |
| 4,731,317 | A | * | 3/1988 | Fromson et al. | 430/159 |
| 4,756,993 | A | | 7/1988 | Kitatani et al. | |
| 4,973,572 | A | | 11/1990 | DeBoer | |
| 5,110,709 | A | | 5/1992 | Aoai et al. | |
| 5,112,743 | A | | 5/1992 | Kamiya et al. | |
| 5,141,838 | A | | 8/1992 | Aoshima et al. | |
| 5,145,763 | A | | 9/1992 | Bassett et al. | |
| 5,202,221 | A | | 4/1993 | Imai et al. | |
| 5,340,699 | A | | 8/1994 | Haley et al. | |
| 5,346,975 | A | | 9/1994 | Aoshima et al. | |
| 5,364,738 | A | | 11/1994 | Kondo et al. | |
| 5,368,974 | A | * | 11/1994 | Walls et al. | 430/156 |
| 5,493,971 | A | | 2/1996 | Lewis et al. | |
| 5,529,891 | A | | 6/1996 | Wang et al. | |
| 5,536,619 | A | | 7/1996 | Verburgh | |
| 5,569,573 | A | | 10/1996 | Takahashi et al. | |
| 5,607,814 | A | * | 3/1997 | Fan et al. | 430/258 |
| 5,609,993 | A | | 3/1997 | Hase et al. | |
| 5,637,428 | A | | 6/1997 | Horie et al. | |
| 5,641,608 | A | | 6/1997 | Grunwald et al. | |
| 5,658,708 | A | | 8/1997 | Kondo | |
| 5,691,114 | A | * | 11/1997 | Burberry et al. | 430/302 |
| 5,698,366 | A | | 12/1997 | Tutt et al. | |
| 5,700,619 | A | | 12/1997 | Baumann et al. | |
| 5,705,308 | A | | 1/1998 | West et al. | |
| 5,705,322 | A | | 1/1998 | West et al. | |
| 5,707,777 | A | | 1/1998 | Aoai et al. | |
| 5,731,123 | A | * | 3/1998 | Kawamura et al. | 430/176 |
| 5,731,127 | A | | 3/1998 | Ishizuka et al. | |
| 5,840,467 | A | * | 11/1998 | Kitatani et al. | 430/302 |
| 5,858,604 | A | | 1/1999 | Takeda et al. | |
| 5,858,626 | A | * | 1/1999 | Sheriff et al. | 430/326 |
| 5,919,600 | A | | 7/1999 | Huang et al. | |
| 5,922,502 | A | * | 7/1999 | Damme et al. | 430/162 |
| 6,004,728 | A | | 12/1999 | Deroover et al. | |
| 6,022,667 | A | | 2/2000 | Vermeersch et al. | |
| 6,060,217 | A | | 5/2000 | Nguyen et al. | |
| 6,060,222 | A | * | 5/2000 | West et al. | 430/326 |
| 6,066,434 | A | | 5/2000 | Blanchet-Fincher et al. | |
| 6,074,802 | A | | 6/2000 | Murata et al. | |
| 6,083,662 | A | | 7/2000 | Miller et al. | |
| 6,083,663 | A | | 7/2000 | Vermeersch et al. | |
| 6,090,532 | A | * | 7/2000 | West et al. | 430/326 |
| 6,096,481 | A | | 8/2000 | Vermeersch et al. | |
| 6,117,613 | A | * | 9/2000 | Kawauchi et al. | 430/270.1 |
| 6,130,026 | A | | 10/2000 | Bennett et al. | |
| 6,132,929 | A | * | 10/2000 | Nakamura et al. | 430/270.1 |
| 6,143,464 | A | * | 11/2000 | Kawauchi | 430/270.1 |
| 6,153,353 | A | * | 11/2000 | Van Damme et al. | 430/270.1 |
| 6,165,677 | A | | 12/2000 | Yako | |
| 6,182,570 | B1 | | 2/2001 | Rorke et al. | |
| 6,186,067 | B1 | | 2/2001 | Rorke et al. | |
| 6,192,798 | B1 | | 2/2001 | Rorke et al. | |
| 6,200,727 | B1 | | 3/2001 | Urano et al. | |
| 6,251,559 | B1 | | 6/2001 | Huang et al. | |
| 6,280,899 | B1 | * | 8/2001 | Parsons et al. | 430/270.1 |
| 6,294,311 | B1 | | 9/2001 | Shimazu et al. | |
| 6,352,811 | B1 | | 3/2002 | Patel et al. | |
| 6,352,812 | B1 | | 3/2002 | Shimazu et al. | |
| 6,358,669 | B1 | | 3/2002 | Savariar-Hauck et al. | |
| 6,534,238 | B1 | | 3/2003 | Savariar-Hauck et al. | |
| 6,573,022 | B1 | | 6/2003 | Miyake et al. | |
| 6,841,330 | B2 | * | 1/2005 | Miyake et al. | 430/156 |
| 6,893,795 | B2 | * | 5/2005 | Kawauchi et al. | 430/271.1 |

FOREIGN PATENT DOCUMENTS

| | | | |
|---|---|---|---|
| DE | 4231324 | | 4/1993 |
| EP | 0368327 | | 5/1990 |
| EP | 0535653 | | 4/1993 |
| EP | 0678380 | | 10/1995 |
| EP | 0784233 | | 7/1997 |
| EP | 794055 | * | 9/1997 |
| EP | 0823327 | | 2/1998 |
| EP | 0864419 | | 9/1998 |
| EP | 0864420 | | 9/1998 |
| EP | 0901902 | | 3/1999 |
| EP | 0908779 | | 4/1999 |
| EP | 0909657 | | 4/1999 |
| EP | 0919868 | | 6/1999 |
| EP | 0940266 | | 9/1999 |
| EP | 0943451 | | 9/1999 |
| GB | 1245924 | | 9/1971 |
| GB | 1488350 | | 10/1977 |
| GB | 1546633 | | 5/1979 |
| JP | 63-270087 | | 11/1988 |
| JP | 02-866 | | 1/1990 |
| JP | 5-94017 | | 4/1993 |
| JP | 7-285275 | * | 10/1995 |
| JP | 09034110 | | 2/1997 |
| WO | WO 97/07986 | | 3/1997 |
| WO | WO 97/39894 | | 10/1997 |
| WO | WO 99/11458 | | 3/1999 |
| WO | WO 99/21715 | | 5/1999 |

OTHER PUBLICATIONS

Kosar, *Light–sensitive Systems*, John Wiley & Sons 1965, pp. 339–352.

Shih et al., *Macromolecules*, vol. 27, No. 12, 1994, pp. 3330–3336.

* cited by examiner

POSITIVE TYPE PHOTOSENSITIVE IMAGE-FORMING MATERIAL FOR USE WITH AN INFRARED LASER

Matter enclosed in heavy brackets [ ] appears in the original patent but forms no part of this reissue specification; matter printed in italics indicates the additions made by reissue.

This application is a divisional, of application Ser. No. 09/173,719, filed Oct. 16, 1998.

BACKGROUND OF THE INVENTION

1. Field of the Invention

The present invention relates to a photosensitive image-forming material and a photosensitive composition, which can be used as an offset printing master. More particularly, the present invention relates to a positive type photosensitive image-forming material for use with an infrared laser and a positive type photosensitive composition for use with an infrared laser, which are suitable for the so-called direct plate making and which are capable of directly making a printing plate using an infrared laser based on digital signals outputted from a computer or the like.

2. Description of the Related Art

Recently, the systems of direct plate making from digital data of computers have been attracted public attention, and the various techniques have been developed. As the systems of direct plate making from digital data of computers, (1) a system using an electrophotography, (2) a system using photopolymerization wherein an Ar laser exposure and an after-heating is carried, (3) a system formed by laminating a silver salt layer on a photosensitive resin, (4) a system of a silver master type, (5) a system formed by breaking a silicone rubber layer by the discharge breakage or laser beam, and the like, have been known.

However, in a (1) system using an electrophotographic method, image forming processes such as electrification, exposure, development and the like are complicated and, therefore, apparatus becomes complicated and large. In the method (2), since a post-heating step is required and the highly sensitive printing plate is utilized, it becomes difficult to handle the plate in an illuminated room. In the systems (3) and (4), those methods have a disadvantage such as the complicated processes and a high-cost since a silver salt is used therein.

The method utilizing a system (5) is a method which have a high level of performance comparatively, but have a problem of the removal of a remaining silicone residue on the print plate.

On the other hand, a laser technology has advanced remarkably in recent years and, particularly, high output and small-sized solid-state lasers and semiconductor lasers, which have a light emission range from the near infra-red region to the infrared region, are easily available, and they are very useful as light sources for an exposure when direct plate making is performed through use of digital data.

As a conventionally known positive planographic printing plate material for an infrared laser which is used for direct plate making conventionally known, an aqueous alkali solution-soluble resin having a phenolichydroxyl group, such as anovolak resin, etc. in used. For example, Japanese Patent Application Laid-Open (JP-A) No. 7-285275 suggests image-forming materials in which a compound, which generates heat upon absorbing light to generate heat, and various onium salts and quinonediazide compounds were adding to the aqueous alkali solution-soluble resin having a phenolic hydroxyl group, such as a novolak resin, etc. These image-forming materials form an image like that the portion of a image area can't remove since the onium salt and quinonediazide compound acts as a dissolution inhibitor of the aqueous alkali solution-soluble resin, and the portion of a non-imaged area can remove since the dissolution inhibitoris decomposed by heat and it don't exert a dissolution inhibition capability.

However, there was a disadvantage such that the place for treatment is limited under a yellow lamp in such an image-forming material, because the onium salts and quinonediazide compounds have a light absorption range in the visible radiation range (350 to 500 nm). Further, the developing property in case of using a solution having low developing capability, that is, the developing property in the under conditions is insufficient, for example, a decomposition rate of the heat decomposable material become lower when exposure is performed by using low-power laser.

Furthermore, there was a problem that the onium salts and quinonediazide compounds don't have always good compatibility with the aqueous alkali solution-soluble resin and compound which generate heat upon absorbing light, therefore, it is difficult to prepare a homogeneous coating solution and to obtain a homogeneous and stable image-forming material.

Japanese Patent Application Publication (JP-B) No. 46-27919 discloses an embodiment of forming an image by using a novolak resin without using a photosensitive compound, but there were problems that the novolak resin itself has poor solvent resistance and, therefore, the plate wear resistance is lowered by use of a cleaner and printing can not be performed by using UV ink.

SUMMARY OF THE INVENTION

Accordingly, an object of the present invention is to improve the poor image-forming property of a recording layer using an aqueous alkali solution-soluble polymer compound, and to provide a positive photosensitive image-forming material for an infrared laser and a photosensitive composition for an infrared laser which are used for the so-called direct plate making which is capable of directly making a printing plate using an infrared laser based on digital signals outputted from a computer or the like. They have characteristics as follows. The positive photosensitive image-forming material and a photosensitive composition are free from the limitations of the place to be handle, and they can be used in the conventional processing devices and the conventional printing devices, and they have an excel lent plate wear resistance, and they have a stable sensitivity to the concentration of a developing solution, that is a good development latitude.

The present inventors have studied intensively. As a result, they have found that it is possible to obtain a photosensitive image-forming material having an aqueous alkali-soluble polymer compound by the forming specific layer construction in which the image-forming material can be used under a white lamp, and has a remarkably improved development latitude. Thus, the photosensitive image-forming material for use with an infrared laser of the present invention has been accomplished.

Furthermore, the present inventors have intensively studied about compounds which have an interaction with an alkali-soluble polymer compound. As a result, they have found that development latitude is remarkably broaden by adding a compound of the following specific structure Thus, the positive photosensitive composition for an infrared laser of the present invention has been accomplished.

A first object of the present invention is to provide a positive type photosensitive image-forming material for use with an infrared laser which comprise a substrate, a layer (A) and a layer (B) wherein the layer (A) contains not less than 50% by weight of a copolymer which contains, as a copolymerization component, not less than 10% by mol of at least one of the following monomers (a-1) to (a-3):

(a-1) a monomer having in the molecule a sulfonamide group wherein at least one hydrogen atom is linked to a nitrogen atom, (a-2) a monomer having in the molecule an active imino group represented by the following general formula (I):

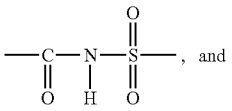

(I)

, and (a-3) a monomer selected from acryl amide, methacryl amide, acrylate, methacrylate and hydroxystyrene, which respectively have a phenolic hydroxyl group; and the layer (B) contains not less than 50% by weight of an aqueous alkali solution-soluble resin having a phenolic hydroxyl group, an the layer (A) and the layer (B) are laminated on said substrate in that order wherein at least said layer (B) contains at least one compound which generates heat upon absorbing light.

A second object of the present invention is to provide a positive type photosensitive composition for use with an infrared laser which comprise at least one alkali-soluble resin, a compound generating heat upon absorbing light and at least one of compound (I) and compound (II) represented by the following formula:

$$R^1—SO_2—SO_2—R^2 \quad (II)$$

$$R^1—SO_2—R^2 \quad (III)$$

wherein $R^1$ and $R^2$ may be the same or different, and $R^1$ and $R^2$each represents a substituted or non-substituted alkyl, alkenyl or aryl group.

DESCRIPTION OF THE PREFERRED EMBODIMENTS

Figure 1:
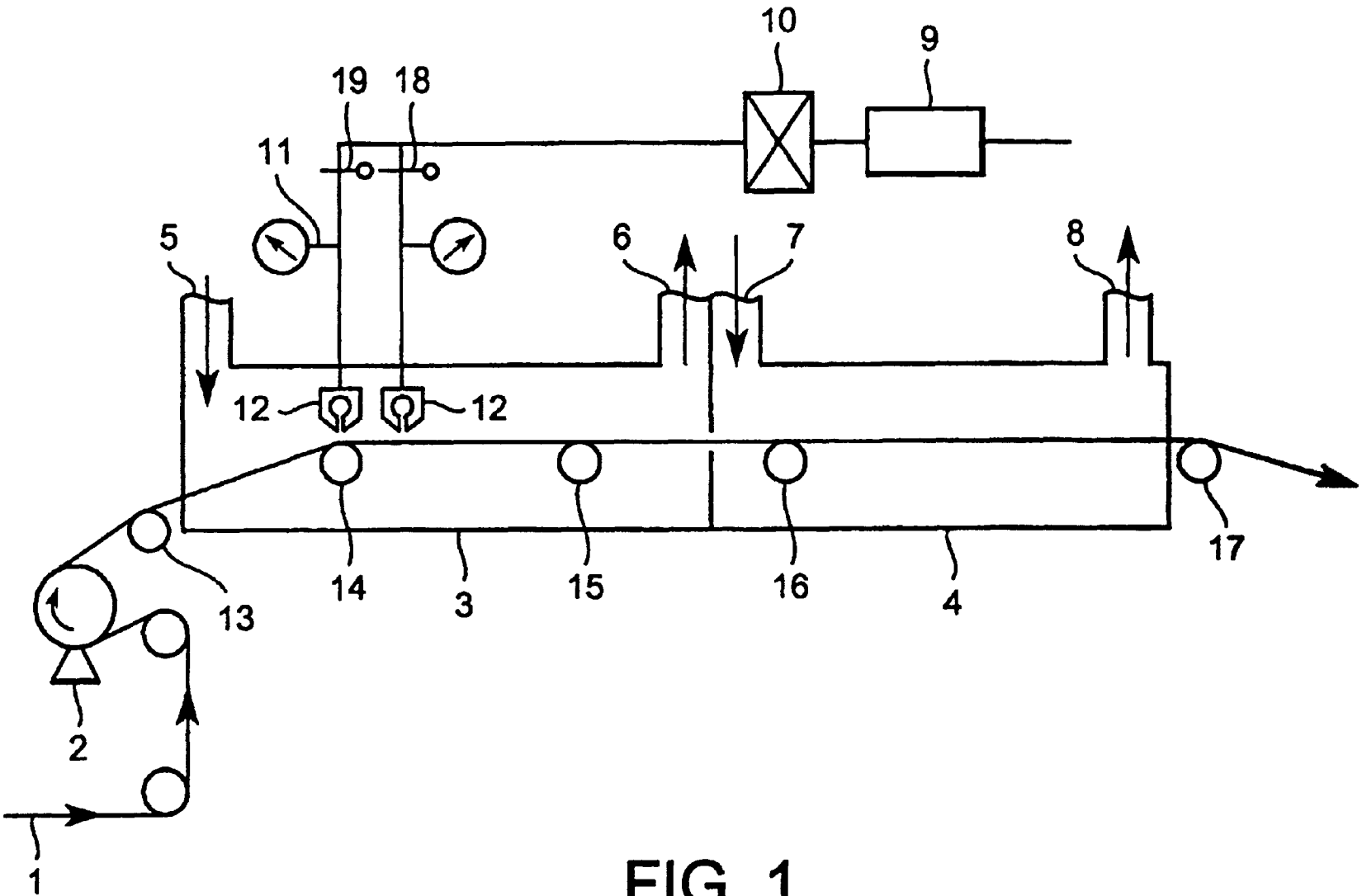
FIG. 1 is a schematic diagram showing one embodiment of a continuous coating/drying device used in the production of the image-forming material of the present invention.

The photosensitive image-forming material for an infrared laser as the first object of the present invention will be described in detail below.

The photosensitive image-forming material for an infrared laser in the present invention have a photosensitive layer which have a double-layer structure. Therefore, the photosensitive image-forming material can have an intermediate layer thereof, on the side close to a substrate, which is superior in the plate wear resistance and solvent resistance because the intermediate layer is containing not less than 50% by weight of a copolymer which contains, as a copolymerization component, not less than 10% by mol of at least one of (a-1) to (a-3); (a-1) a monomer having in a molecule a sulfonamide group wherein at least one hydrogen atom is linked to a nitrogen atom (hereinafter, appropriately, referred to as a monomer having a sulfonamide group), (a-2) a monomer having in a molecule an active imino group represented by the general formula (1) (hereinafter, appropriately, referred to as a monomer having imino group) and (a-3) a monomer selected from acrylamide, methacrylamide, acrylate, methacrylate and hydroxystyrene, which respectively have a phenolic hydroxyl group (hereinafter, appropriately, referred to as a monomer having a phenolic hydroxyl group).

Further, a layer containing not less than 50% by weight of an aqueous alkali solution-soluble resin having a phenolic hydroxyl group and containing at least a compound which generates heat upon absorbing light is formed on the above intermediate layer. The use of the above aqueous alkali solution-soluble resin, which may be represented by a novolak resin, can realize the broad development latitude because the resin has a strong interaction with a compound which generates heat upon absorbing light, a high sensitivity by exposure in an image-forming, and a high development inhibition effect in the unexposed areas.

There is a fear in the vicinity of the substrate such that a development is not efficiently performed because the heat generated by a compound which generates heat upon absorbing light is dispersed to the substrate having high thermal conductivity, before the temperature of the exposed areas of a photosensitivity layer increases to the heat region enough to cause the reaction. In the image-forming material of the present invention, the sensitivity and the development latitude are improved remarkably because the layer (A), corresponding the intermediate layer described above, exists between the layer (B) and the substrate, so a heat generated by the compound which generates heat upon absorbing light in layer (B) is not dispersed to the substrate, and the heat can be efficiently used for development.

In the present invention, the use of the photosensitive layer having a double-layer structure and the interaction between an aqueous alkali solution-soluble resin and a compound which generates heat upon absorbing light in the layer (B) make it possible to form a excellent image. Consequently, compounds, such as onium salts, quinonediadide compounds or the like having light absorbing region (350–500 nm) within a visible region, are not required. Therefore, the photosensitive image-forming material in the present invention can be used under a white lamp, and there is no disadvantage such that the place to handle is limited under a yellow lamp. Since image formation can be performed without the thermal descomposition reaction using such as onium salts, quinonediadide compounds or the like, the heat is efficiently used for image formation, and the development latitude is remarkably improved.

In the present invention, the aqueous alkali solution-soluble polymer compound used for forming the layer (A) contains not less than 50% by weight of a copolymer (hereinafter refer to a specific copolymer,) containing, as a copolymerization component, not less than 10% by mol of at least one of (a-1) to (a-3), (a-1) a monomer having a sulfonamide group, (a-2) a monomer having an active imino group and (a-3) a monomer having a phenolic hydroxyl group.

(a-1) The monomer having a sulfonamide group may include a monomer of a low-molecular weight compound having in a molecular one or more a sulfonamide group, wherein at least one of hydrogen atom bound to a nitrogen atom, and one or more polymerizable unsaturated bound.

Among them, a low-molecular weight compound having an acryloyl group, an allyl group or vinyloxy group and a substituted or mono-substituted aminosulfonyl group or a substituted iminosulfonyl group is preferable.

Examples of these compounds include compounds represented by the following general formula (IV) to (VIII).

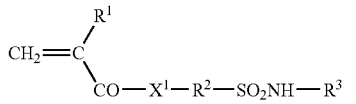

(IV)

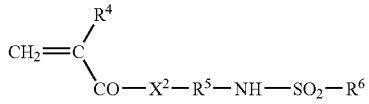

(V)

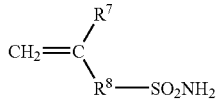

(VI)

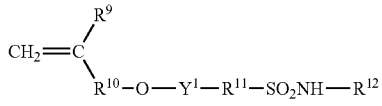

(VII)

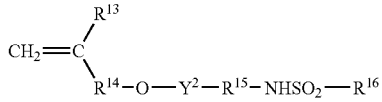

(VIII)

Wherein $X^1$ and $X^2$ represents respectively —O— or —$NR^7$—. $R^1$ and $R^4$ represents respectively a hydrogen atom or —$CH_3$. $R^2$, $R^5$, $R^9$, $R^{12}$ and $R^{16}$ represent respectively an alkylene group, a cycloalkylene group, an arylene group or an aralkylene group having 1 to 12 carbon atoms, which may have a substituent respectively. $R^3$, $R^7$ and $R^{13}$ represents a hydrogen atom, an alkyl group, acycloalkyl group, an aryl group or an aralkyl group each having 1 to 12 carbon atoms, which may have respectively a substituent. $R^6$ and $R^{17}$ represents an alkyl group, a cycloalkyl group, an aryl group or an aralkyl group having 1 to 12 carbon atoms, which may have a substituent respectively. $R^8$, $R^{10}$ and $R^{14}$ represents a hydrogen atom or —$CH_3$. $R^{11}$ and $R^{15}$ represents an alkylene group, a cycloalkylene group, an arylene group or an aralkylene group having 1 to 12 carbon atoms, which may have a single bond or a substituent respectively. $Y^1$ and $Y^2$ represents respectively a single bond or —CO—.

Specifically, m-aminosulfonylphenyl methacrylate, N-(p-aminosulfonylphenyl)methylacrylamide, N-(p-aminosulfonylphenyl)acrylamide or the like can be suitably used for (a-1).

(a-2) The monomer having an active imino group may include a monomer formed of a low-molecular weight compound having in the molecule one or more active imino group represented by the aforementioned general formula (I) and one or more polymerizable unsaturated bound.

Specifically, concrete examples of these compounds include N-(p-toluenesulfonyl)methacrylamide, N-(p-toluenesulfonyl)acrylamide or the like, and can be suitably used.

(a-3) The monomer having a phenolic hydroxyl group may include a monomer of acrylamide, methacrylamide, acrylate, methacrylate or hydroxystyrene, which respectively have at least one phenolic hydroxyl group.

Specifically, concrete examples of these compounds include N-(4-hydroxyphenyl)acrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, phydroxystyrene or the like, and can be suitably used.

It is necessary that the aqueous alkali solution-soluble copolymer contains not less than 10% by mol of at least one of the above (a-1) to (a-3), as a copolymerization component, wherein said copolymer is the photosensitive image-forming material of the present invention and used for forming the layer (A) adjacent to the substrate, and those which contains not less than 20% by mol is more preferable. When the copolymerization component is less than 10%, the sensitivity is reduced because the solubility of the aqueous alkali solution-soluble copolymer to an alkali developing solution is remaining low even after exposure. Therefore, the effect of improving the plate wear resistance and sensitivity as an advantage in case of using this copolymerization component becomes insufficient.

This copolymer may include copolymerization components other than (a-1) to (a-3) monomer having a phenolic hydroxyl group listed above.

As another copolymerization components, for example, monomers specified the following (1) to (12) can be used;

(1) acrylates or metacrylates having an aliphatic hydroxyl group such as 2-hydroxyethyl acrylate, 2-hydroxyethyl metacrylate or the like.

(2) alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate or the like.

(3) alkyl methacrylate such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate or the like.

(4) acrylamide or methacrylamide such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide or the like.

(5) vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether or the like.

(6) vinyl esters such as vinyl acetate, vinyl choloro acetate, vinyl butylate, vinyl benzoate or the like.

(7) styrenes such as styrene, α-methylstyrene, methylstyrene, chloromethylstyrene or the like.

(8) vinyl ketones such as methyl vinyl ketone, ethyl vinyl ketone, propyl vinyl ketone, phenyl vinyl ketone or the like.

(9) olefins such as ethylene, propylene, isobutylene, butadiene, isoprene or the like.

(10) N-vinyl pyrrolidone, N-vinyl carbazole, 4-vinyl pyridine, acrylonitrile, methacrylonitrile or the like.

(11) unsaturated imide such as maleimide, N-acryloylacrylamide, N-acetylmethacrylamide, N-propylonylmethacrylamide, N-(p-cholorobenzoyl) methacrylamide or the like.

(12) unsaturated carboxylic acid such as acrylate, methacrylate, maleic anhydride, itaconic acid, a monomer represented by the following general formula (IX) to (XI).

(IX)

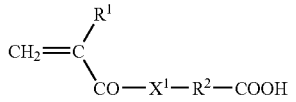

(X)

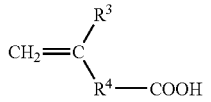

(XI)

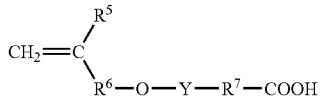

$R^1$, $R^3$ and $R^5$ represents hydrogen or a methyl group respectively; $R^3$, $R^4$, $R^6$and $R^7$ represents an alkylene group, a cycloalkylene group, an arylene group or an aralkylene group having 1 to 12 carbon atoms, which may have a substituent respectively; X represents —O' or —$NR^8$—; and Y represents a single bond or —CO—. $R^8$ represents a hydrogen atom, an alkyl group, a cycloalkyl group, an aryl group or an aralkyl group having 1 to 12 carbon atoms, which may have a substituent.

Specific examples of the above monomer include N-(4-carboxyphenyl)-methacrylamide, N-(2-carboxyphenyl)-acrylamide, N-(4-chloro-2-carboxyphenyl)-methacrylamide, 4-carboxyphenylethyl methacrylate, 4-carboxystylene, 2-carboxyphenyloxyethyl acrylate or the like.

As the copolymer contained in the layer (A) in the present invention, those having a weight-average molecular weight of not less than 2000 and a number-average molecular weight of not less than 500 are preferable. More preferably, these copolymers have a weight-average molecular weight of 5000 to 300,000 and a number-average molecular weight of 800 to 250,000, and the degree of molecular dispersion (weight-average molecular weight/number-average molecular weight) is from 1.1 to 10.

These copolymers contained in the layer (A) may be used single or in combination of above monomers, and are used in the amount of not less than 50%, more preferably not less than 55% based on the solid content of all of the material forming the layer (A). When the amount of this copolymer is less than 50%, the plate wear resistance of the image-forming material is deteriorated.

The polymer compound having a phenolic hydroxyl group, such as resole-type phenol resin, novolak-type phenol resin or the like can be contained in the layer (A) other than the above copolymers.

Examples thereof include novolak resin and pyrogallol acetone resin such as phenol formaldehyde resin, m-cresol formaldehyde resin, p-cresol formaldehyde resin, o-cresol formaldehyde resin, m-/p-mixture cresol formaldehyde resin, phenol/cresol (any of m-, p-, o- or m-/p-, m-/o-, o-/p-mixed may be used) mixed formaldehyde resin or the like.

Resole-type phenol resins, phenol/cresol (any of m-, p-, o- or m-/p-, m-/o-, o-/p-mixed may be used) mixed formaldehyde resins are preferable, and the phenol resins described in Japanese Patent Application Laid-Open (JP-A) No.61-217034 is particularly preferable.

Furthermore, a condensation product of a phenol having an alkyl group having 3 to 8 carbon atoms as a substituent and a formaldehyde, such as t-butylphenol formaldehyde resin, octylphenol formaldehyde resin or the like, may be used in combination as described in U.S. Pat. No. 4,123,279. These copolymers may be used single or in combination thereof.

An urethane resin may be also contained. Among them, an urethane resin having a carboxy group or a sulfonamide group is preferable. The polyurethane resin used suitably in the present invention is a polyurethane resin having a reaction product of a diisocyanate compound and a diol compound having, as a basic structure, sulfonamide group wherein at least one of H atom bonds to N.

Diisocyanate compounds used suitably in the present invention include aromatic diisocyanate compounds such as 2,4-tolylenediisocyanate, dimers of 2,4-tolylenediisocyanate, 2,6-tolylenediisocyanate, p-xylylene diisocyanate, m-xylylene diisocyanate, 4,4'-diphenylmethane diisocyanate, 1,5-naphtylene diisocyanate, 3,3'-dimethylbiphenyl-4,4'-diisocyanate or the like; an aliphatic diisocyanate compounds such as hexamethylene diisocyanate, trimethylhexamethylene diisocyanate, lysine diisocyanate, dimer acid diisocyanate or the like; an alicyclic diisocyanate compounds such as isophorone diisocyanate, 4,4'-methylenebis(cyclohexylisocyanate), methylcyclohexane-2,4(or 2,6)diisocyanate, 1,3-(isocyanatemethyl)cyclohexane or the like; and a diisocyanate compound, a reactant diisocyanate of diol such as an adduct between one mol of 1,3-butylene glycol and 2 mol of trilene diisocyanate and or the like.

Furthermore, a diol compound having a sulfonamide group bound to least one of H atom on N includes p-(1,1-dihydroxymethylethylcarbonylamino)benzenesulfonamide, N-ethyl form of p-(1,1-dihydroxymethylethylcarbonylamino)benzenesulfonamide, N-(m-methylsulfonylaminophenyl)-2,2-dihydroxymethylpropanamide, N-(p-methylsulfonylaminophenyl)-2,2-dihydroxymethylpropanamide, N-(m-ethylsulfonylaminophenyl)-2,2-dihydroxymethylpropanamide, N-(p-ethylsulfonylaminophenyl)-2,2-dihydroxymethylpropanamide, N-(2,2-(dihydroxyethylaminocarbonyl)ethyl)metanesulfonamide, N-(2,2-(dihydroxyethylaminocarbonyl) ethylbenzenesulfonamide, N-(2,2-(dihydroxyethylaminocarbonyl)ethyl-p-toluenesuifonamide or the like.

These diol compounds having a sulfonamide group can be used alone or in combination thereof.

Furthermore, a diol compound, which have no sulfonamide group and has another substituent which does not reacting with isocyanate, can be also used in combination with a diol compound having a sulfonamide group.

These diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butyl-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an adduct of bisphenol A with ethylene oxide, an adduct of bisphenol A with propylene oxide, an adduct of bisphenol F with ethyleneoxide, anadduct of bisphenol F with propylene oxide, an adduct of hydrogenated bisphenol A with ethylene oxide, an adduct of hydrogenated bisphenol A with propylene oxide, hydroquinone dihydroxyethyl ether, p-xylylene glycol, dihydroxyethylsulfon, bis(2-hydroxyethyl)-2,4-tolylene carbamate, 2,4-tolylene-bis(2-hydroxyethylcarbamide), bis(2-hydroxyethyl)-m-xylylene dicarbamate, bis(2-hydroxyrthyl)isophthalate, 3,5-dihydroxy benzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid or the like.

The polyurethane resin which can be used in the present invention is synthesized by adding a known catalyst, which have adequate activity to the above a diisocyanate compound or a diol compound, to the said compound in an aprotic solvent, and heating them. The molar ratio of diisocyanate to a diol compound used is preferably from 0.8:1 to 1.2:1, and more preferably from 0.85:1.1 to 1.1:1. When an isocyanate group is remained at the terminals of the polymer, a polyurethane resin wherein isocyanate groups are not remaining can be obtained finally, by treating this terminals with alcohols, amines or the like.

The weight-average molecular weight of the urethane polymers which can be used in the present invention is preferably not less than 2,000, more preferably in the range of from 5,000 to 300,000. The number-average molecular weight is preferably not less than 1,000, more preferably in the range of from 2,000 to 250,000. Degree of molecular dispersion (weight-average molecular weight/number-average molecular weight) is preferably not less than 1, more preferably in the range of 1.1 to 10.

Further, unreacted monomers may be contained in a binder which can be used in the present invention. In this case, the ratio of monomers in the binder is preferably not more than 15% by weight.

Various additives can be added in a composition forming this layer (A), if necessary, other than the above copolymer compositions. In view of an improvement in property of inhibiting dissolution of a image part into a developing solution, it is preferred to use a material which is thermally decomposable and, in a non-decomposable state, is capable of substantially lowering the solubility of an aqueous alkali solution-soluble polymer compound, such as onium salt, quinonediazide compound, aromatic sulfone compound, aromatic sulfonate compound or the like.

Onium salts may include the following diazonium salts, ammonium salts, phosphonium salts, iodonium salts, sulfonium salts, selenium salts, arsonium salts or the like. Diazonium salts is particularly preferable in the present invention. Furthermore, a particularly suitable diazonium salt includes those which is described in Japanese Patent Application Laid-Open (JP-A) No.5-158230.

Suitable examples of onium salts of the present invention include, for example, diazonium salts described in S. I. Schlesinger, Photogr. Sci. Eng., 18, 387 (1974), T. S. Bal et al., Polymer, 21, 423 (1980), Japanese Patent Application Laid-Open (JP-A) No.5-158230; ammonium salts described in U.S. Pat. Nos. 4,069,055, 4,069,056, and Japanese Patent Application Laid-Open (JP-A) No.3-140140; phosphonium salts described in D. C. Necker et al, Macromolecules, 17, 2468(1984), C. S. Wen et al, Teh, Proc. Conf. Rad. Curing ASIA, p478 Tokyo, Oct (1988), U.S. Pat. Nos. 4,069,055 and 4,069,056; iodonium salts described in J. V. Crivello et al., Macromolecules, 10(6), 1307 (1977), Chem. & Eng. News, Nov. 28, p31 (1988), EP Patent No. 104,143, U.S. Pat. Nos. 339,049 and 410,201, Japanese Patent Application Laid Open (JP-A) Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EP Pat. Nos. 370,693, 233,567, 297,443 and 297,442, U.S. Pat. Nos. 4,933,377, 3,902,114, 410,201, 339,049, 4,760,013, 4,734,444 and 2,833,827, DE Pat. Nos. 2,904,626, 3,604,580 and 3,604,581; selenium salts described in J. V. Crivello et al., Macromolecules, 10(6), 1307 (1977), J. V. Crivello et al., J. Polymer Sci., Polymer Chem. Ed., 17, 1047 (1979); arsonium salts described in C. S. Wen. et al., Teh, Proc. Conf. Rad. Curing ASIA, p478 Tokyo, Oct (1988); or the like.

Examples of suitable quinonediazides include o-quinonediazide compound.

A o-quinonediazide compound used in the present invention is a compound which has at least one of o-quinonediazide group, and can increase the solubility of the resin to alkali by thermal decomposition, and compounds having a various structure can be used. The solubility of a photosensitive material system is assisted by both effects, in the image portion, such that o-quinonediazide loses the capability of inhibiting the dissolution of a binder by thermal decomposition and that o-quinonediazide itself vary to an alkali-soluble material. As the o-quinonediazide compound used in present invention, for example, the compound described in J. Corser "light-Sensitive Systems" (John Wiley & Sons. Inc.) pp.339–352 can be used, and a sulfonate or sulfonamide of o-quinonediazide, which is reacted with various aromatic polyhydroxy compounds or aromatic amino compounds are suitable. Esters of benzoquinone(1,2)-diazidesulfonyl chloride or naphtoquinone-(1,2)-diazide-5-sulfonyl chloride with pyrogallol-acetone resin as described in Japanese Patent Application Publication (JP-B) No.43-28403, and esters of benzoquinone-(1,2)-diazidesulfonyl chloride or naphtoquinone-(1,2)-diazide-5-sulfonyl chloride with phenol-formaldehyde resin are also suitably used.

Furthermore, esters of naphtoquinone-(1,2)-diazide-4-sulfonyl chloride with phenol-formaldehyde resin or cresol-formaldehyde resin, and ester of naphtoquinone-(1,2)-diazide-4-sulfonyl chloride with pyrogallol-acetone resin are also suitably used.

The amount of the o-quinonediazide compound is preferably in the range from 1 to 50% by weight, more preferably from 5 to 30% by weight, and particularly from 10 to 30% by weight, based on all of the solid components of the layers of the printing plate material. These compounds can be used single or in combination thereof. The other useful o-quinonediazide compounds have been reported in a number of patents and known. Examples thereof include, for example, those which are described in each specification of Japanese Patent Application Laid-Open (JP-A) Nos. 47-5303, 48-63802, 48-63803, 48-96575, 49-38701, 48-13354, Japanese Patent Application Publication (JP-B) Nos. 41-11222, 45-9610, 49-17481, U.S. Pat. Nos. 2,797,213, 3,454,400, 3,544,323, 3,573,917, 3,674,495, 3,785,825, British Patent Nos. 1,227,602, 1,251,345, 1,267,005, 1,329,888, 1,330,932, German Patent No.854,890 or the like.

The counter ions of onium salts may include tetrafluoroboric acid, hexafluorophosphoric acid, triisopropylnaphthalenesulfonic acid, 5-nitro-o-toluenesulfonic acid, 5-sulfosalicylic acid, 2,5-dimrthylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-haphthol-5-sulfonic acid, 2-methoxy-4-hydroxy-5-benzoyl-benzenesulfonic acid, paratoluenesulfonic acid or the like. Among them, alkyl aromatic sulfonic acids such as hexafluorophospholic acid, triisopropylnaphthalenesulfonic acid or 2,5-dimrthylbenzenesulfonic acid are suitable.

The amount of the additives other than o-quinonediazide canpound is preferably in the range from 1 to 50% by weight, more preferably from 5 to 30% by weight, and particularly from 10 to 30% by weight based on all of the solid components of the layers of the printing plate material.

Furthermore, cyclic acid anhydrides, phenols and organic acids can be also used in combination thereof for the purpose of further improving the sensitivity. As cyclic acid anhydrides, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromeleic anhydride, $\alpha$-phenylmaleic anhydride, succinic anhydride, pyromellitic anhydride or the like as described in U.S. Pat. No. 4,115,128 specification are can be used. Phenols may include bisphenol A, p-nitrophenol, p-ethoxyphenol, 2,4,4'-trihydroxybenzophenone, 2,3,4-trihydroxybenzophenone, 4-hydroxybenzophenone, 4,4',4'-trihydroxytriphenylmethane, 4,4',3",4"-tetrahydroxy-3,5,3',5'-tetramethyltriphenylmethane or the like. Furthermore, organic acids include sulfonic acids, sulfinic acids, alkylsulfuric acids, phosphonic acids, phosphoric esters, carboxylic acids or the like described in Japanese Patent Application Lade-Open (JP-A) Nos.60-88942, 2-96755 or the like. Examples thereof include p-toluenesulfonic acid, dodecylbenzenesulfonic acid, p-toluenesulfininc acid, ethylsulfuric acid, phenylsulfonic acid, phenylphosphinic acid, phenyl phosphoric acid, diphenyl phosphoric acid, aromatic benzoic acid, isophthalicacid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid or the like.

The amount of the above cyclic acid anhydrides, phenols and organic acids in the material forming the layer (A) is preferably in the range from 0.05 to 20% by weight, more preferably from 0.1 to 15% by weight, and particularly from 0.1 to 10% by weight based on all of the solid components of the layer (A).

In the present invention, at least one fatty acid having a large number of carbon atoms, so called wax, or its derivative can be added in the layer (A) to improve stability before development. Fatty acids or esters of fatty acid having an alkyl group or alkenyl group having 6 to 32 carbon atoms (for example, a straight-chain alkyl group such as n-hexyl group, n-heptyl group, n-octyl group, n-nonyl group, n-decyl group or n-undecyl group; an alkyl group having branch, such as 14-methylpentadecyl group, 16-methylheptadecyl group; and an alkenyl group such as 1-hexenyl group, 1-heptenyl group, 1-octenyl group, 2-methyl-1-heptenyl group) are preferred. Among them, those having an alkyl group or alkenyl group having carbon atoms of not more than 25 are preferred in view of the solubility to a coating solvent. Examples of the compounds which can be used as fatty acid include enanthic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacseric acid, undecylic acid, oleic acid, elaidic acid, cetleinic acid, erucic acid, brassidic acid or the like. Examples of fatty esters include methyl ester, ethyl ester, propyl ester, butyl ester, dodecyl ester, phenyl ester and naphtyl ester of these fatty acids. Examples of thiofatty esters include methylthio ester, ethylthio ester, propylthio ester, butylthio ester and benzylthio ester of these fatty acids. Examples of amides of fatty acid include amides, methylamides, ethylamides or the like of these fatty acids.

One or more kinds of these compounds may be used in combination. These compounds are used in the amount in the range from 0.02 to 10% by weight, preferably from 0.2 to 10% by weight, particularly from 2 to 10% by weight, based on all of the solid components of the layers of the printing plate material. When the amount of the compound in layer (A) is less than 0.02%, the development stability against the blemishes is insufficient. On the other hand, when the amount reaches 10% by weight, the effect achieved saturation and, therefore, there is no need to add more than.

Furthermore, in order to improve the processing stability to variations of development processing conditions, nonionic surfactants described in Japanese Patent Application Laid-Open (JP-A) Nos. 62-251740 and 3-208514, amphoteric surfactants described in Japanese Patent Application Laid-Open (JP-A) Nos. 59-121044 and 4-13149 may be added to the material forming the layer (A).

Examples of nonionic surfactants are sorbitan tristearate, sorbitan monopalmitate, sorbitan trioleate, stearic acid monoglyceride, polyoxyethylene nonyl phenyl ether and the like.

Examples of amphoteric surfactants are alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type amphoteric surfactant (for example, trade name; Amogen K, manufactured by Daiichikogyo K. K.), and the like. The amount of the above nonionic surfactants and amphoteric surfactants in the material forming the layer (A) is preferably in the range from 0.05 to 15% by weight, and more preferably from 0.1 to 5% by weight based on all of the solid components of the layer (A).

Dyes and pigments as image-coloring agents and/or printout agents in order to immediately obtain visible image after heating by exposure may be added to the material forming the layer (A) of the present invention.

Representative examples of printout agents are combinations of organic dyes capable of forming a salt with a compound which generate acid by heating by exposure (a photo acid generating agent). Examples thereof are a combination of organic dyes, which may form a salt, and o-naphthoquinonediazide-4-sulfonic acid harogenide described in Japanese Patent Application Laid-Open Nos. 50-36209 and 53-8128, and combinations of organic dyes, which may form a salt, and a trihalomethyl compound described in Japanese Patent Application Laid-Open Nos. 53-36223, 54-74728, 60-3626, 61-143748, 61-151644 and 63-58440. Such trihalomethyl compounds are oxazole type compounds and triazole type compounded,and both of them are superior in the stability over time and provides an excellent print out image.

As the coloring agents of image, various dyes may be used other than the above organic dyes which form salts. Suitable dyes containing organic dyes which form salts include oil soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS and Oil Black T-505 (manufactured by Orient Kagakukogyo K. K.), Victoria Pure Blue, Crystal Violet (CI42555), Methyl Violet (CI42535), Ethyl Violet, Rhodamine B (CI145170B), Malachite Green (CI42000), Methylene Blue (CI52015) and the like. Dyes described in Japanese Patent Application Laid-Open (JP-A) No. 62-293247 are particularly preferred. These dyes may be added in the amount within the range from 0.01 to 10% by weight, preferably from 0.1 to 3% by weight, based on all of the solids content of the material forming the layer (A).

A plasticizer may be added to this material forming the layer (A), if necessary, in order to impart flexibility to the coating. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tretrahydrofurfuryl oleate, an oligomer and a polymer of acrylic acid or methylacrylic acid and the like are used.

Furthermore, long chain fatty acid ester, long chain fatty acid amide and the like may be added to improve strength of film.

A surfactant for improving the coating properties, for example, a fluorosurfactant described in Japanese Patent Application Laid-Open (JP-A) No. 62-170950 may be added to the material forming layer in the present invention. The amount is preferably from 0.01% to 1% by weight, more preferably from 0.05% to 0.5% by weight based on all of the said components of the layers of the printing plate material.

When the image-forming material of the present invention is used as negative type, in ordertoforman alkali-insoluble film part(an image part), there is need to add a material which crosslinks in the presence of an acid.

As the material which crosslinks in the presence of an acid, (a) a compound having two or more hydroxymethyl groups or alkoxymethyl groups, epoxy groups or vinyl ether groups within the molecule, which bond to a benzene ring, (b) a compound having a N-hydroxymethyl group, N-alkoxymethyl group or N-acyloxymethyl group, (c) epoxy compounds and the like are suitably used in the photosensitive layer of the present invention.

(a) Examples of compounds which have in the molecule two or more hydroxymethyl groups or alkoxymethyl groups which bond to a benzene ring, include methylol melamine, resole resin, epoxy-modified novolak resin, urea resin and the like. Furthermore, the compounds listed in "Crosslinking Agents Handbook" (written by Shinzo Yamashita & Tousuke Kaneko, Taiseisya Co. , Ltd.) are also preferred. Particularly, a phenol derivative having two or more hydroxymethyl groups or alkoxymethyl groups in the molecule is preferably because it provides excellent strength of imaging part after printing. Concrete example thereof is resole resin.

However, these crosslinking agents which crosslinks in the presence of an acid are unstable to heat and exhibit poor stability during a storage after being incorporated into an image recording material. On the contrary, a phenol derivative which has two or more hydroxymethyl groups or alkoxymethyl groups linking to a benzene ring in the molecule, and contains 3 to 5 benzene rings which may have some substituents, and has a molecular weight of not more than 1,200, can exhibit good stability in storage and this derivative is used most suitably in the present invention. As the above alkoxymethyl groups contained in this phenol derivative, the one having not more than 6 carbon atoms is preferably. Preferred and concrete examples of the above alkoxymethyl groups include a methoxymethyl group, ethoxymethyl group, n-propoxymethyl group, i-propoxymethyl group, n-butoxymethyl group, i-butoxymethyl group, sec-butoxymethyl group and t-butoxymethyl group are preferred. An alkoxy-substituted alkoxy group such as 2-methoxyethoxy group and 2-methoxy-1-propyl group is also preferred.

Phenol derivatives having a hydroxymethyl group can be obtained by allowing to react a phenol compound having no corresponding hydroxymethyl group with formaldehyde in the presence of a basic catalyst. In this case, the reaction is preferably carried out at a temperature of 60° C. or lower to prevent resinification and gelation. More particularly, the phenol derivatives can be synthesized by the methods described in Japanese Patent Application Laid-Open (JP-A) Nos. 6-282067 and 7-64285 and the like.

Phenol derivatives having an alkoxymethyl group can be obtained by reacting a phenol derivative having a corresponding hydroxymethyl group with an alcohol in the presence of an acid catalyst. In this case, the reaction is preferably carried out at a temperature of 100° C. or lower to prevent resinification and gelation. More particularly, the phenol derivatives can be synthesized by the methods described in EP Patent No. 632003A1 and the like.

(b) Compounds having a N-hydroxymethyl group, a N-alkoxymethyl group or a N-acyloxymethyl group can include a monomer, oligomer-melamine-formaldehyde condensate and urea-formaldehyde condensate disclosed in EP Patent (hereinafter described as EP-A) No. 0,133,216, German Patent Nos. 3,634,671, 3,711,264, alkoxy-substituted compounds disclosed in EP-A No. 0,212,482 and the like.

More preferred examples include, for example, a melamine-formaldehyde derivative having at least two free N-hydroxymethyl groups, N-alkoxymethyl groups or N-acyloxymethyl groups, Among them, a N-alkoxymethyl derivative is particularly preferable.

(c) Epoxy compounds can include a monomer, a dimer, an oligomer and a polymer-type epoxy compound wherein they have at least one or more epoxy group. Examples thereof include a reactant of bisphenol A and epichlorohydrin, a reactant of low-molecular weight phenol-formaldehyde resin and epichlorohydrine and the like. An epoxy resin described and used in U.S. Pat. No. 4,026,705 and British Patent No. 1,539,192 can be also listed.

The amounts of a crosslinking agent in the present invention, in case of using the crosslinking agent which crosslinks in the presence of an acid, is from 5 to 70% by weight, and preferably from 10 to 65% by weight based on the solid content of the layer (A). When the amount of the crosslinking agent which crosslinks in the presence of an acid is less than 5% by weight, a film strength of image part after image are recorded will deteriorate. On the other hand, when the amount of more than 70% by weight, it is not preferable in view of the stability during the storage.

These cross inking agents which crosslinks in the presence of an acid may be used single or in combination thereof.

The coated amount of all of the material forming the layer (A) which may be coated on the substrate of the image-forming material is preferable in the range from 0.5 to 4.0 $g/m^2$. When the coated amount is less than 0.5 $g/m^2$, the effect of improving the plate wear resistance becomes insufficient.

In the image-forming material of the present invention, a layer (B), which contain not less than 50% by weight of an aqueous alkali solution-soluble resin having a phenolic hydroxyl group, is laminated on the layer (A) which formed on a substrate by the above specific copolymer and the like.

The resin having a phenolic hydroxyl group, which is a main component forming the layer (B), may include novolak resin, for example, phenol-formaldehyde resin, m-cresol formaldehyde resin, p-cresol-formaldehyde resin, m-/p-mixed cresol-formaldehyde resin, phenol/cresol (any of m-, p- or m-/p-mixed may be used) mixed formaldehyde resin and the like.

These resins having a phenolic hydroxyl group preferably have the weight-average molecular weight of from 500 to 20,000, and the number-average molecular weight of from 200 to 10,000.

Furthermore, a condensate of phenol having an alkyl group having 3 to 8 carbon atoms as a substitute and formaldehyde, such as t-butyl phenol-formaldehyde resin and octhyl phenol-formaldehyde resin, may be used in combination as described in U.S. Pat. No. 4,123,279. Such resin having a phenolic hydroxyl group may be used in combination thereof.

A compound which generates heat upon absorbing light is also contained with a resin having a phenolic hydroxyl group in this layer (B). This compound which generates heat upon absorbing light is those which has the light absorbing region in infrared region of 700 nm or more, preferably in the region of from 750 to 1200 nm, and exhibits the ability to convert light to heat under light of a wave length within this region More particularly, various pigments or dyes which generate heat upon absorbing light, in this wavelength region, may be used.

As the pigments used in the present invention, commercially available pigments and pigments described in Color Index (C. I.) Handbook, "Saishin Ganryo Binran (Modern Pigment Handbook)" (Edited. by Nihon Ganryo Gijutsu Kyokai, published in 1977), "Saishin Ganryo Oyo Gijutsu (Modern Pigment Application Technology)" (CMC Publishing Co., published in 1986), "Insatsuink Gijutsu (Printing Ink technology)" (CMC Publishing Co., published in 1984) may be utilized.

Examples of the pigments are a black pigment, a yellow pigment, an orange pigment, a brown pigment, a red pigment, a purple pigment, a blue pigment, a green pigment, a fluorescent pigment, a metal powder pigment, and polymer-bonded-pigment. More particularly, an insoluble azo pigment, an azo lake pigment, a condensensed azo pigment, a chelate azo pigment, a phthalocyanine pigment, an anthraquinone pigment, perylene and perynone pigments, athioindigopigment, aquinacridonepigment, adioxazinepigment, an isoindolinone pigment, aquinophthalonepigment, in-mold decorating lake pigment, an azine pigment, a nitroso pigment, a nitro pigment, a natural pigment, a fluorescent pigment, an inorganic pigment, carbon black and the like. Among these pigments, carbon black is preferable.

These pigments may be used without a surface treatment, or they may be used after a surface treatment. Surface treating methods include a method of coating a resin or wax on the surface of pigments, a method of adhering a surfactant to the surface of pigments, a method of bonding a reactive substance (such as a silane coupling agent, epoxy compound, polyisocyanate and the like) to the surface of pigments. The above surface treating methods are described in "Kinzoku Sekken no Seishitsu to Oyo (Natures and Applications of Metal Soaps)", Saiwai Publishing Co., "Insatsuink Gijutsu (Printing Ink Technology)", CMC Publishing Co., published in 1984; and "Saishin Ganryo Oyo Gijutsu (Modern Pigment Application Technology)", CMC Publishing Co., published in 1986.

The particle size of the pigment is preferably in the range from 0.01 μm to 10 μm, more preferably from 0.05 μm to 1 μm, particularly from 0.1 μm to 1 μm. When the particle size of the pigment is less than 0.01 μm, it is not preferable in view of the stability of the pigment dispersion in a coating solution for photo-sensitive layer. When the particle size exceeds 10 μm, it is not preferable in view of the uniformity of an image recording layer.

As amethod of dispersing a pigment, known methods used forpreparing an ink or toner may be employed. Examples of a dispersing machine are an ultransonic dispersing machine, sand mill, attritor, pearl mill, super mill, ball mill, impeller, disperser, KD mill, colloid mill, dynatron, triple roll mill, pressure kneader and the like. Details thereof are described in "Saishin Ganryo Oyo Gijutsu (Modern Pigment Application Technology)", CMC Publishing Co., published in 1986.

As the dye, known dyes which are commercially available or are described in the literature (for example, "Senryobinran (Dye Handbook)" edited by Yukigoseikagaku Kyokai, published in 1970) may be utilized. More particularly, dyes such as an azo dye, a metal complex azo dye, a pyrazolone azo dye, an anthraquinone dye, a phthaocyanine dye, a carbonium dye, a quinoneimine dye, a methine dye, a cyanine dye and the like are exemplified are specified.

In the present invention, the pigments or dyes absorbing an infrared light or a near infrared light is particularly preferable in these pigments or dyes, for the purpose of the use of laser irradiating an infrared or a near infrared light.

As such apigment absorbing infrared or near infrared light, carbon black is suitably used. Dyes absorbing infrared or near infrared light include cyanine dyes described in Japanese Patent Application Laid-Open (JP-A) Nos. 58-125246, 59-84356, 59-202829, 60-78787 and the like, methine dyes described in Japanese Patent Application Laid-Open (JP-A) Nos. 58-173696, 58-181690, 58-194595 and the like, naphthoquinone dyes described in Japanese Patent Application Laid-Open (JP-A) Nos. 58-112793, 58-224793, 59-48187, 59-73996, 60-52940, 60-63744 and the like, squarylium dyes described in Japanese Patent Application Laid-Open (JP-A) No. 58-112792 and the like, cyanine dyes described in GB 434,875 and the like.

In addition, near infrared absorbing sensitizers described in U.S. Pat. No. 5,156,938 are suitably used. A substituted arylbenzo(thio)pyrylium salt described in U.S. Pat. No. 3,881,924, trimethinethiapyrylium salt described in Japanese Patent Application Laid-Open (JP-A) No. 57-142645 (U.S. Pat. No. 4,327,169), pyrylium compounds described in Japanese Patent Application Laid-Open (JP-A) Nos. 58-181051, 58-220143, 59-41363, 59-84248, 59-84249, 59-146063, and 59-146061, a cyanine dye described in Japanese Patent Application Laid-Open (JP-A) No. 59-216146, a pentamethinethipyrylium salt described in U.S. Pat. No. 4,283,475, and the like, pyrylium compounds described in Japanese Patent Application Publication (JP-B) Nos. 5-13514 and 5-19702, Epolight 111-178, Epolight 111-130, Epolight 111-125 and the like are also particularly preferably used.

Further, other examples of preferable dyes are near-infrared absorbing dyes which are represented by the formulae (I) and (II) described in U.S. Pat. No. 4,756,993.

These dyes or pigments may be added in the image recording material in the amount within the range from 0.01% to 50% by weight, preferably from 0.1% to 10% by weight, based on the total weight of total solids component of material forming the layer (B). In the case of dyes, the amount is particularly from 0.5% to 10% by weight. In the case of pigments, the amount is particularly from 3.1% to 10% by weight. When the amount of pigment or dye is less than 0.01% by weight, the sensitivity is lowered. On the other hand, when the amount exceeds 50% by weight, the uniformity of the photosensitive layer is lost and the durability of the recording layer is deteriorated.

It is necessary to add at least one of compounds which generates heat upon absorbing light, such as dyes or pigments, to the layer (B), and they may be added to another layers in the image forming material, for example, to the layer (A) previously explained.

As a compound which generates heat upon absorbing light in the present invention, a compound may be added to the layer (B) such that the compound has the function of lowering the [solubi I ity] *solubility* of the resin, which

[have] *has a* phenolic hydroxyl group and is a constituent material of the layer (B), and further, the above dissolution-lowering function is lowered by heating. Examples of the compound include a compound represented by the following formula (XII).

(XII)

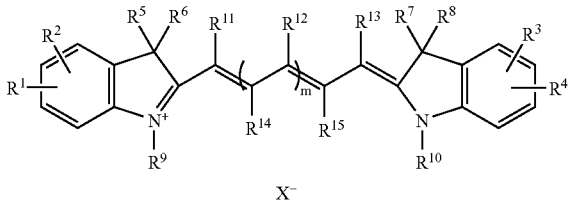

The above compound has a property of absorbing light to generate heat wherein the absorption region is from 700 nm to 1200 nm in the infrared region, and has a good compatibility with an aqueous alkali solution-soluble resin, and is a basic dye. This compound can control the [solubi I ity] *solubility* of the resin to an aqueous alkali solution by the interaction with the resin, because the compound has groups in the molecule, such as an ammonium group, iminium group and the like, which can interact with the aqueous alkali solution-soluble resin. Therefore, it may be suitably used in the present invention.

In the above general formula (XII), $R^1$ to $R^4$ each independently represents an alkyl group, an alkenyl group, an alkoxy group, a cycloalkyl group or an aryl group which may have a hydrogen atom or a substituent and each has 1 to 12 carbon atoms, and $R^1$ and $R^2$, $R^3$ and $R^4$ may [binds] *be linked to* each other to form a ring. Concrete examples of $R^1$ to $R^4$ include a hydrogen atom, a methyl group, an ethyl group, a phenyl group, a dodecyl group, a naphthyl group, a vinyl group, an allyl group, a cyclohexyl group and the like. When these groups have a substituent, the substituent may be a halogen atom, a carbonyl group, a nitro group, a nitryl group, a sulfonyl group, a carboxyl group, carboxylate, sulfonate and the like.

$R^5$ to $R^{10}$ each independently represents an alkyl group *or aryl group* having 1 to 12 carbon atoms, which may have a substituent, and concrete examples of $R^5$ to $R^{10}$ include a methyl group, an ethyl group, a phenyl group, a dodecyl group, a naphthyl group, a vinyl group, an allyl group, a cyclohexyl group and the like. When these groups have a substituent, the substituent is a halogen atom, a carbonyl group, a nitro group, a nitryl group, a sulfonyl group, a carboxyl group, carboxylate, sulfonate and the like.

$R^{11}$ to $R^{13}$ respectively represent a hydrogen atom, a halogen atom or an alkyl group having 1 to 8 carbon atoms, which may have a substituent, and $R^{12}$ may [line] *be linked* to $R^{11}$ or $R^{13}$ to form a ring. When m is [larger than] 2 *or more*, plural $R^{12}$ *groups, which may be the same or different,* may link to each other to form a ring. Examples of $R^{11}$ to $R^{13}$ include a chlorine atom, a cyclohexyl group, a [cyclopenthyl] *cyclopentyl* ring or cyclohexyl ring obtained by combining $R^{12}$ *groups with* each other and the like. When these groups have a substituent, examples of the substituent include a halogen atom, a carbonyl group, a nitro group, a nitrile group, a sulfonyl group, a carboxyl group, carboxylate, sulfonate and the like. In addition, m stands for an integer of 1 to 8, preferably 1 to 3.

$R^{14}$ and $R^{15}$ independently represent a hydrogen atom, a halogen atom or an alkyl group having 1 to 8 carbon atoms, which may have a substituent, and $R^{14}$ may *be* linked to $R^{15}$ to form a ring. When *m* is [larger than] 2 *or more*, a plurality of [$R^{12}$ may combined] $R^{14}$ *groups, which may be the same or different, may be linked to* each other to form a ring. Examples of $R^{14}$ or $R^{15}$ include a chlorine atom, a cyclohexyl group, a [cyclopenthyl] *cyclopentyl* ring or cyclohexyl ring obtained by combining $R^{14}$ *groups with* each other and the like. When these groups have a substituent, the substituent [include] *includes* a halogen atom, a carbonyl group, a nitro group, a nitrile group, a sulfonyl group, a carboxyl group, carboxylate, sulfonate and the like. In addition, m stands for an integer of 1 to 8, preferably 1 to 3.

In the above general formula (XII), examples of anion represented by X- include perchloric acid, tetrafluoroboric acid, hexafluorophosphoric acid, triisopropyinaphthalenesulfonic acid, 5-nitro-o-toluenesulfonic acid, 5-sulfosalicylic acid, 2,5-dimrthylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-haphthol-5-sulfonic acid, 2-methoxy-4-hydroxy-5-benzoyl-benzenesulfonic acid, paratoluenesulfonic acid or the like. Among them, alkyl aromatic sulfonic acids such as hexafluorophospholic acid, triisopropylnaphthalenesulfonic acid or 2,5-dimrthylbenzenesulfonic acid are suitable.

The compound represented by the above general formula (XII) is a compound generally referred to as a cyanine dye, more particularly, the compounds represented below are suitably used but the present invention is not limited by this embodiment.

Cyanine dye A

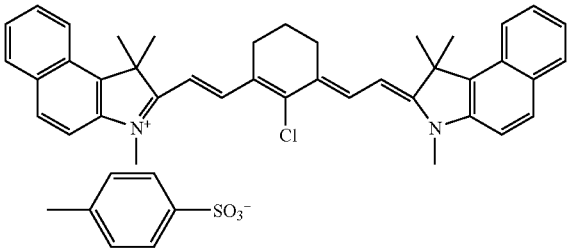

Cyanine dye B

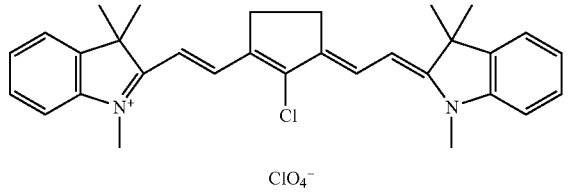

Cyanine dye C

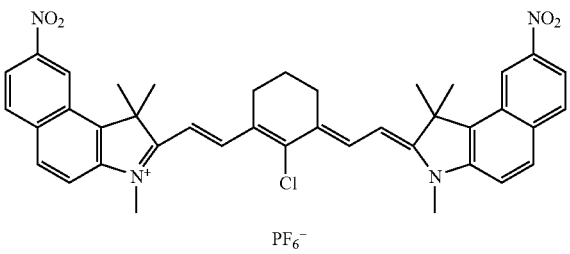

-continued

Cyanine dye D

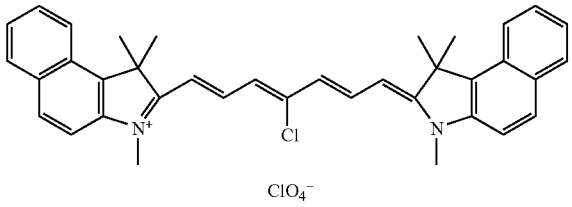

Cyanine dye E

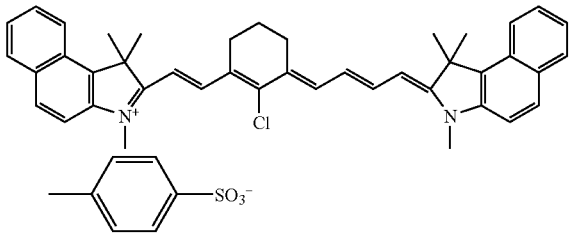

In the present invention, in case of using a compound such as the above cyanine dye in the layer (B), the amounts of this compound to be added is preferably in the range from 99/1 to 70/30, and more preferably from 99/1 to 75/25, based on the amount of aqueous alkali solution-soluble resin in view of the sensitivity.

Various additives may be added to this composition forming the layer (B), if necessary. As an additives capable of using in the layer (B), any types of additives, which preferably include the listed above additives capable of adding to a composition forming the layer (A), can be also utilized in a composition forming the layer (B). In addition, when the material of the present invention use as a negative image-forming material, it is preferable to add a crosslinking agent to this layer (B) as well as the layer (A).

These photosensitive layers can be produced generally by the methods of dissolving the above components to a solvent and coating on a substrate. However, when the two layers are formed by coating sequentially by normal method, a co-dissolution of the two layers occurs by the effect of solvent or the I Ike at the interface between two layers, and the situation happens like that the layer (A) and layer (B) can not be formed separate and distinctly. Therefore, there is a fear that the effect of the present invention decrease by the above phenomenon. Accordingly, there is need to form the two layers on the substrate, wherein no co-dissolving of them occurs, in producing the image-forming material of the present invention.

Examples of this method include methods such as a method which use the difference of the solvent solubility of a copolymer contained in the (A) and an alkali-soluble resin contained in the layer (B), and a method by drying and removing the solvent rapidly after coating the second layer.

Now these methods will be described in detail below, but a method of coating two layers separately, wherein the double layer is formed, is not limited thereto.

The method, which use the difference of the solvent solubility of a copolymer contained in the layer (A) and an alkali-soluble resin contained in the layer (B), is a method which use a solvents for an alkali-soluble resin contained in the layer (B), wherein the solvents can not dissolve a copolymers contained in the layer (A) such as the specific copolymers and copolymers which can be used in combination with the said specific copolymer. This method makes it possible to form each layer distinctly separated even after double layer coating is conducted.

For example, the double layer can be formed as follows; at first, selecting a copolymer, in the copolymers having the specific monomer of the layer (A), which is insoluble in one solvent wherein an alkali-soluble resin can be dissoluble in the solvent, such as methyl ethyl ketone, 1-methoxy-2-puropanol or the like; and coating the copolymer on the substrate using the other solvent which can dissolve this copolymer; and the drying the layer (A); and coating the layer (B), which is mainly comprising an alkali-soluble resin, using the solvent, which dose not dissolve the layer (A), that is methyl ethyl ketone, 1-methoxy-2-puropanol or the like.

On the other hand, the method, which is performed by drying and removing the solvent rapidly after coating the second layer, can be achieved by the method of spraying a high-pressure air through a slit nozzle, constituted at almost right angle to a direction of running web, or by the method of giving heat energy wherein the heat is conducted from under surface of web of a roll having hating medium therein for example steam (heating roll), or by combining these methods.

FIG. 1 shows one example of devices which performs continuous coating and drying of the second layer (B) on the layer (A), after the first layer (A) has been coated and dried. In the device in FIG. 1, a surface-roughened aluminum web was used as a example of the substrate, and the second layer is provided on the first layer coated product wherein the first layer was previously provided on this substrate.

This device is equipped with a coating head 2 in which a coating solution for second coating layer is coated on a first coating layer 1, a first drying zone 3 in which high-speed drying by blowing of hot-air and blowing of high-pressure air are performed, and a second drying zone 4 for hot-air drying. The first drying zone 3 is provided with an air inlet 5 for feeding a hot air, a high-pressure air generator 9 for high-speed drying, a heat exchanger 10, a pressure indicator 11, a high-speed spraying nozzle 12, airflow control dampers 18, 19 and an air exit 6 for exhausting a hot air from the system. The second drying zone 4 is provided with an air inlet 7 for feeding a hot air and an air exit 8 for exhausting a hot air from the system. Furthermore, guide rolls 13–17 for conveying an aluminum web 1 are respectively arranged in an appropriate position of this device.

In this device, a coating solution for the second layer (layer (B)) is coated on the first layer coated product 1 (layer (A)) which is continuously running in a rate of 5 to 150 m/min through the coating head 2 in a rate of 5 to 40 ml/m$^2$, and fed to the drying zone 3 wherein drying is usually progressed to the first layer coated product 1 wherein the temperature thereof is usually from 50 to 150° C. An evaporated solvent gas is exhausted trough the air exit 6 from this system with a hot air. When the drying of the second-layer coating is performed at the inlet or in the vicinity of the inlet of the first drying zone 3 by the hot air, the second-layer coating is still in the undried state generally.

This second-coated layer in the undried state is rapidly dried by high-speed air blown to the conveying position through the high-speed spraying nozzle 12 arranged almost vertically to the running direction of the first layer coated product 1.

High-pressure air is generated by the high-pressure air generating device 9 comprising a compressor or a high-pressure blower, and heated to 50 to 200° C. by the heat exchanger 10, and adjusted to desired air flow by the air flow control damper 18, 19, and then fed to the high-speed spraying nozzle 12. Therefore, slit-type high-pressure air, which have desired temperature and flow rate for drying the second layer film in state undried, can collide hardly, and this makes it possible to evaporate a solvent from the coated product rapidly within very short time and to form the second layer. The internal pressure of in the nozzle 12 which blow high-pressure air is usually 300 mmAq ($H_2O$) to 3 kg/cm$^2$, and preferably 1000 mmAq ($H_2O$) to 3 kg/cm$^2$. The flow rate of spraying air through the high-speed spraying nozzle 12 is about from 20 m/s to 300 /ms. The width between slits of the high-speed spraying nozzle 12 is about 0.1 to 5 mm, and preferably 0.3 to 1 mm. In addition, the spraying angle of high-pressure blast to the first layer coated product 1 is from 0° to 90°, and preferably from 10° to 60°. Furthermore, the number of the nozzle is two in the figure, but may be 1 to 8 according to the loading of dry.

Thus, the coating for the second layer is dried by the high-speed air drying in the first drying zone 3. Then, the first layer coated product in which the second layer is formed thereon is fed to the second drying zone, and is heated by hot-air of the temperature of 30 to 200° C. from the intake vent 7. Consequently, the trace amount of the residual solvent in the coating is controlled in the range from 30 to 200 mg/m$^2$. The solvent gas is exhausted from the exhaust vent 8 with hot air. Thus, the desired double layered-coating can be achieved by these drying operation.

Alternatively, as example of the latter method, a drying by a heating roll may be conducted instead of the drying by high-speed blast as described above for forming the photosensitive layer of image-forming material of the present invention. One example of the devices in this case is a device wherein high-pressure generating device 9, heat exchanger 10, pressure gauge 11, high-pressure air spraying nozzle 12 and air flow control damper 18, 19 is not equipped, but a heating roll is equipped instead of a guide roll in FIG. 1. In this case, the surface of the roll can be heated to a temperature of from 80 to 200° C. by provided the heating medium, such as steam, inside the roll. The surface of the such heating roll can provide the heat energy to an aluminum web of the first layer coat product, thereby making it possible to perform drying.

Furthermore, the combination of the dryings by a high-speed air and by a heating roll can be conducted preferably, as the method of rapidly removing the solvent from the coating. Example of the device in the case, for example, is a device of FIG. 1 wherein a heating roll is placed instead of a guide roll 14, and this device makes it possible to rapidly evaporate the solvent.

The above example such as the device of FIG. 1 is designed to conduct hot-air drying in the first drying zone 3, and then a hot-air drying and high-pressure air drying or/and a drying by using a heating roll are conducted. However, the first drying by hot-air may be omitted, and the drying by high-pressure air may conduct immediately after the coating.

As the method of forming the image-forming material of the present invention, a method using the continuous coating and drying device, such as the device described FIG. 1, is preferable because the continuously coating and drying method is very efficiently in view of the extension of the degree of freedom of blending.

It is preferable to place a device for coating and drying of the first layer at upstream of the device for coating and drying of the second layer, and these devices may be the same device each other. Further, it is preferable to place a surface-roughening means at upstream of a coating head of the device for coating and drying of the first layer. These methods, which can perform a continuous production which use a continuously running substrate, is preferable in view of an improvement in productivity.

The weight ratio of a layer (A) to a layer (B), wherein layer (A) contains not less than 50% by weight of a copolymer which contains, as a copolymerization component, not less than 10% by mol of at least one of (a-1) to (a-3) and a layer (B) contains not less than 50% by weight of an aqueous alkali solution-soluble resin, such as novolak resin, is voluntary and not limited, however it is preferably from 10:90 to 95:5, particularly from 20:80 to 90:10 by weight.

The photosensitive solution to be coated on the substrate is used by dissolving the components in a suitable solvent. Examples of the solvents are not limited to specified ones but include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyllactone, toluene and the like.

The concentration of the components (total solid component including additives) in the solvent is preferably from 1% to 50% by weight.

These solvents may be used single or in combination thereof. The coated amount (solid content) obtained after coating and drying on the substrate may vary depends on its use, but is preferably from 0.5 to 5.0 g/m$^2$ for a photosensitive printing plate. Various coating methods may be used, such as bar coater coating, spin coating, spray coating, curtain coating, dip coating, air knife coating, blade coating, roll coating and the like. As the coated amount becomes smaller, the apparent sensitivity becomes higher, but the coating properties of the image recording layer deteriorats.

A positive photosensitive image-forming material for use with an infrared laser as the second object of the present invention will be now described in detail below.

The positive photosensitive image-forming material for use an infrared laser of the present invention is an infrared ray-photosensitive compound. It is characterized by comprising an alkali-soluble polymer compound and a material which generates heat upon absorbing light, and further comprising at least one of specific disulfone compound or sulfone compound represented by the general formula (II) or (III),or comprising both them. When an laser irradiated to this composition, in an exposed areas, the material which generates heat upon absorbing light absorbs light and generates heat, and this heat decreases an interaction between an alkali-soluble polymer compound and a compound which is a disulfone compound or sulfone compound represented by the general formula (II) or (III), therefore, alkali-solubility of the alkali-soluble polymer compound increases, by the decrease of the above interaction. On the other hand, in an unexposed areas, heat is not generated, and the interaction between the alkali-soluble copolymer compound and the compound, which is a disulfone compound or sulfone compound, don't decreases. That is, an inhibition force of the compounds represented by the general formula (II) or (III) to a solubility, which is a solubility of the alkali-soluble copolymer to an alkali developing solution, is maintained. As a result, the difference of the solubility of the alkali-soluble copolymer to the alkali developing solution area becomes large between a light-exposed area and a light-unexposed, and the development latitude becomes broad.

The interaction between a sulfone compound represented by the aforementioned general formula (III) and novolak resin, which is an alkali-soluble polymer, has been described in Proc. SPIE, vol. 1086, 48(1989). However, this literature describes about only an interaction between an additive having the structure of general formula (III) and novolak resin as an alkali-soluble polymer, but does not describe at all about a viewpoint of reducing the interaction by heat which is generated by the exposure using a laser, and obtaining image. This is a new finding found by the present invention. Further, the methods has been previously known that a heat-decomposable compound, such as onium salts, is added to the infrared ray-photosensitive composition like it described in said literature. In those methods, alkali-solubility of an alkali-soluble polymer is inhibited when the known heat decomposable compounds in the non-decomposed form, on the other hand, alkali-solubility of an alkali-soluble polymer is increase when the known heat decomposable compounds in the decomposed form wherein the inhibiting force is decrease. These methods conducts a development by utilizing the difference of those alkali-solubility. However, the present invention can achieve the broader development latitude, in comparison with those cases of using the known heat decomposable compounds.

The positive photosensitive composition for use with an infrared laser of the present invention is an infrared-photosensitive composition comprising an alkali-soluble polymer and a material absorbing light to generate heat, and further comprising at least one of, or both, compounds represented by the following formulas:

$$R^1—SO_2—SO_2—R^2 \quad (II)$$

$$R^1—SO_2—R^2 \quad (III)$$

Wherein $R^1$ and $R^2$ may be the same or different, and $R^1$ and $R^2$ represent a substituted or non-substituted alkyl, alkenyl or aryl group.

An alkyl group of the above general formula (II) or (III) is a straight-chain, branched or cyclic one, and one preferably having 1 to 10 carbon atoms. Examples thereof include a methyl group, ethyl group, propyl group, butyl group, hexyl group, octyl group, decyl group, isopropyl group, isobutyl group, tert-butyl group, 2-ethylhexyl group, cyclohexyl group and the like. Examples of a substituted alkyl group include the above alkyl group which is substituted by a halogen atom such as a chlorine atom, an alkoxy group having 1 to 6 carbon atom such as a methoxy group, an aryl group such as a phenyl group, an aryloxy group such as a phenoxy group or the like. Concrete examples thereof include a monochloromethyl group, adicholoromethyl group, a trichloromethyl group, a bromomethyl group, a 2-chloroethyl group, a 2-bromoethyl group, a 2-methxyethyl group, a 2-ethoxyethyl group, a phenylmethyl group, a naphthylmethyl group, a phenoxymethyl group and the like.

An alkenyl group includes, for example, a vinyl group, and a substituted alkenyl group. Examples of a substituted alkenyl group includeavinyl group substituted byan alkyl groupsuch as methyl group,or an aryl group such as phenyl group. Concrete examples thereof include a 1-methylvinyl group, a 2-methylvinyl group, a 1,2-dimethylvinyl group, a 2-phenylvinyl group, a 2-(p-methylphenyl)vinyl group, a 2-(p-methoxyhenyl)vinyl group, a 2-(p-chlorophenyl)vinyl group, a 2-(o-chlorophenyl)vinyl group and the like.

Furthermore, an aryl group is preferably a single ring or two rings. Examples thereof include a phenyl group, a α-naphthyl group, a β-naphthyl group and the like. Examples of a substituted aryl group include the above aryl group substituted by an alkyl group having 1 to 6 carbon atoms such as methyl group, an ethyl group, an alkoxy group having 1 to 6 carbon atoms such as a methoxy or an ethoxy group, a halogen atom such as chlorine atom, a nitro group, a phenyl group, a carboxy group, a hydroxy group, an amide group, an imide group, a cyano group or the like. Examples thereof include a 4-chlorophenyl group, a 2-chlorophenyl group, a 4-bromophenyl group, a 4-nitrophenyl group, a 4-hydroxyphenyl group, a 4-phenylphenyl group, a 4-methylphenyl group, a 2-methyiphenyl group, a 4-ethylphenyl group, a 4-methoxyphenyl group, a 2-methoxyphenyl group, a 4-ethoxyphenyl group, a 2-carboxyphenyl group, a 4-cyanophenyl group, a 4-methyl-1-naphthyl group, a 4-chloro-1-naphthyl group, a 5-nitro-1-naphthyl group, a 5-hydroxy-1-naphthyl group, a 6-chloro-2-naphthyl group, a 4-bromo-2-naphthyl group, a 5-hydroxy-2-naphthyl group and the like.

A disulfone compound represented by the general formula (II) used in the present invention can be synthesized according to methods described in G. C. Denser, Jr et al. "Journal of Organic Chemistry" 31, 3418–3419 (1966), a method described in T. P. Hilditch "Journal of the Chemical Society" 93, 1524–1527 (1908) or a method described in O. Hinsberg scripsit "Berichte der Deutschen Chemischen Gesellschaft" 49, 2593–2594 (1916). That is, a method of synthesizing from sulfinic acid represented by the general formula (X III) using cobalt sulfate in an aqueous solution of sulfuric acid, a method of synthesizing from sulfonyl chloride represented by the general formula (X IV) using ethyl xanthate, or a method of reacting sulfinic acid represented by the general formula (X III) with sulfonyl chloride represented by the general formula (X IV) under basic condition.

$$R^1—SO_2H \quad (X\ III)$$

$$R^2—SO_2Cl \quad (X\ IV)$$

wherein $R^1$ and $R^2$ may be the same or different, and $R^1$ and $R^2$ each represents a substituted or non-substituted alkyl, alkenyl or aryl group.

Specific examples of the disulfone compounds represented by the general formula (II) used in the present invention include the followings.

(II-1)

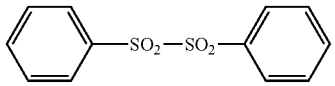

(II-2)

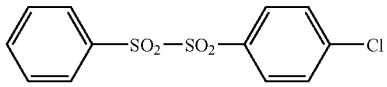

(II-3)

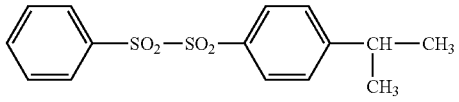

(II-4)

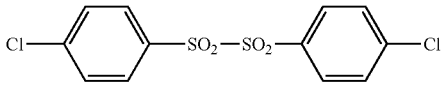

(II-5)

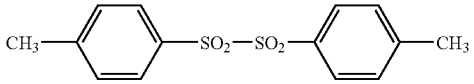

(II-6)

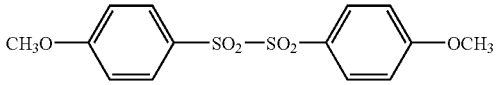

-continued
(II-7)
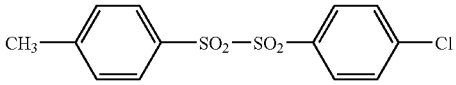
(II-8)
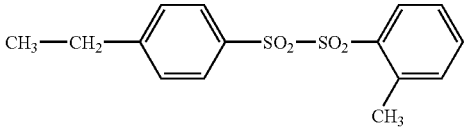
(II-9)
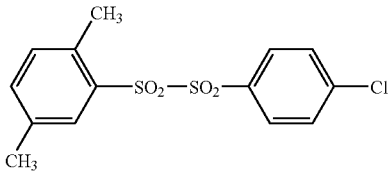
(II-10)
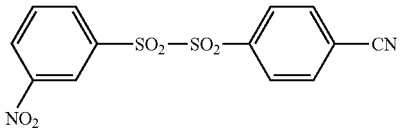
(II-11)
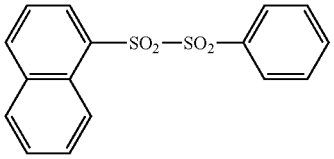
(II-12)
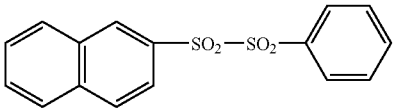
(II-13)
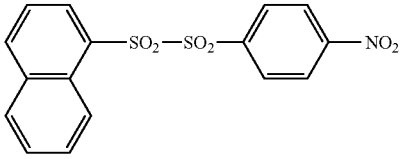
(II-14)
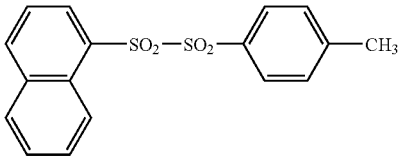
(II-15)
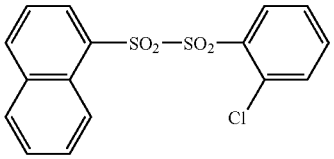
(II-16)
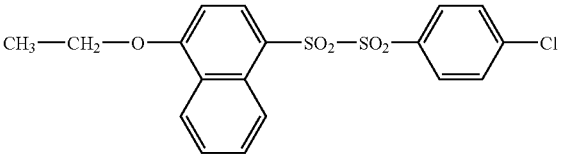
-continued
(II-17)
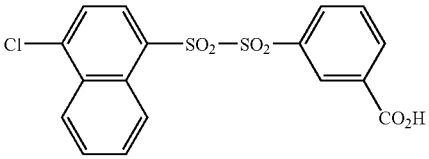
(II-18)
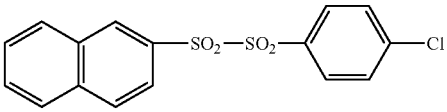
(II-19)
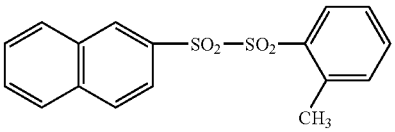
(II-20)
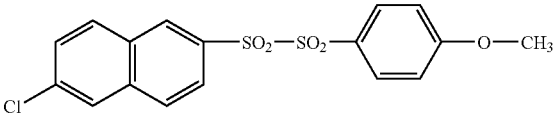
(II-21)
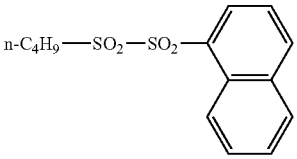
(II-22)
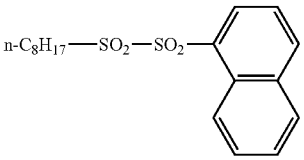
(II-23)
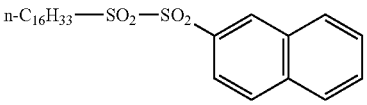
(II-24)
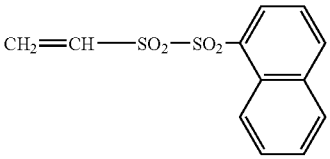
(II-25)
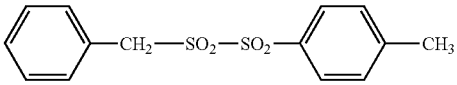
(II-26)
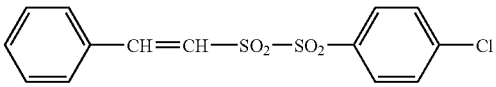
(II-27)
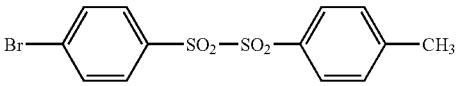
(II-28)
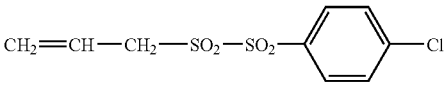

-continued (II-29)

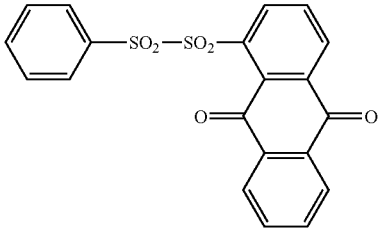

(II-30)

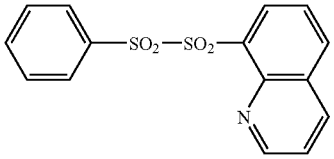

(II-31)

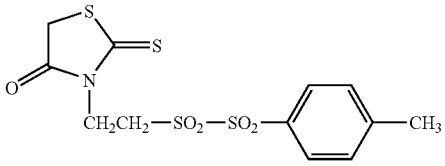

(II-32)

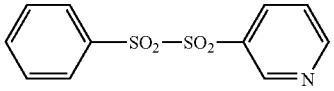

(II-33)

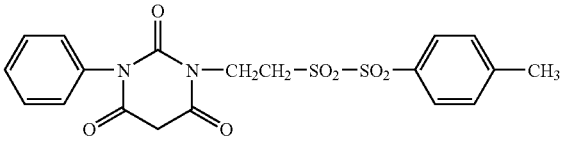

(II-34)

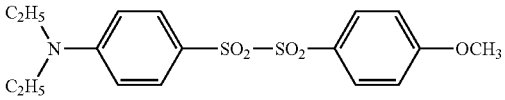

A sulfone compound represented by the general formula (III) used in the present invention can be generally obtained by oxidizing the corresponding sulfide compound with a conventional method.

Specific examples of the disulfone compounds represented by the general formula (III) used in the present invention include the followings.

(III-1)

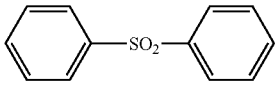

(III-2)

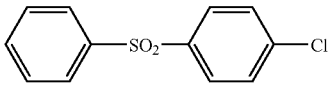

(III-3)

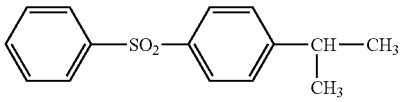

(III-4)

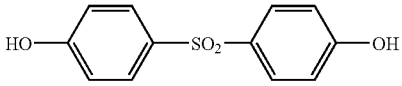

-continued (III-5)

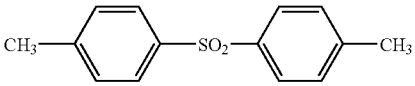

(III-6)

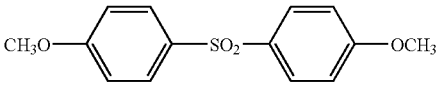

(III-7)

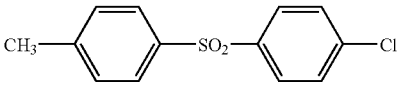

(III-8)

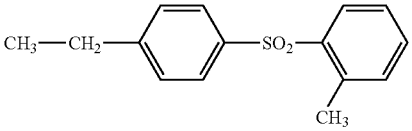

(III-9)

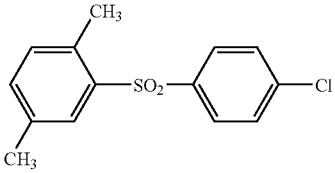

(III-10)

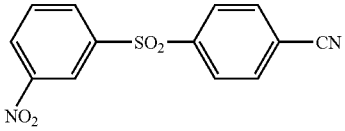

(III-11)

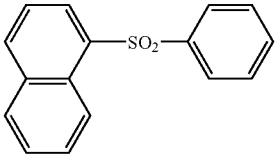

(III-12)

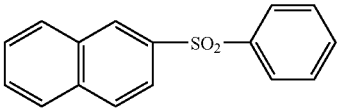

(III-13)

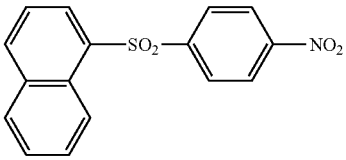

(III-14)

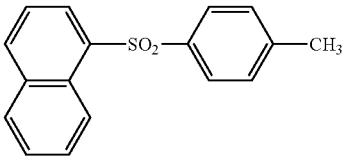

(III-15)

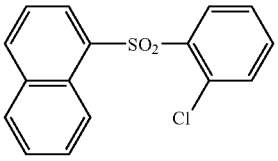

-continued
(III-16)
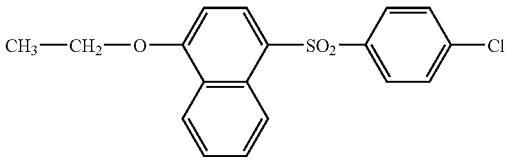
(III-17)
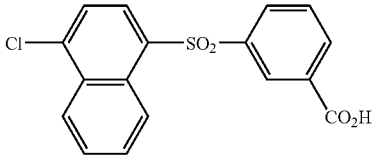
(III-18)
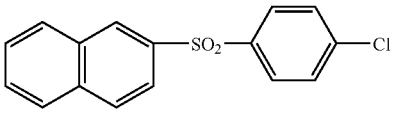
(III-19)
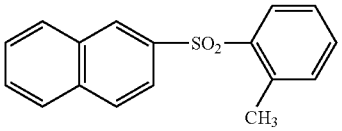
(III-20)
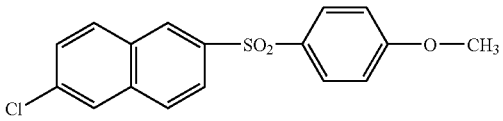
(III-21)
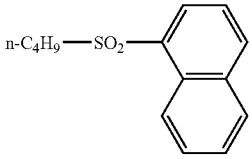
(III-22)
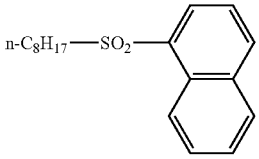
(III-23)
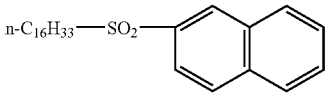
(III-24)
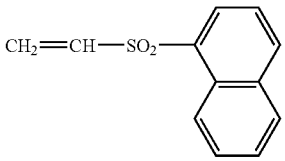
(III-25)
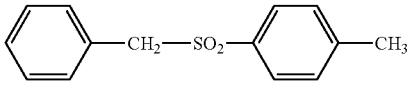
(III-26)
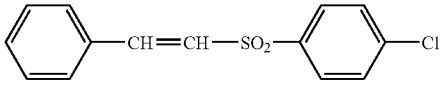
-continued
(III-27)
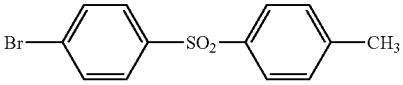
(III-28)
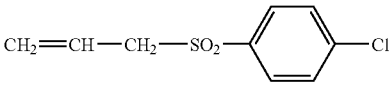
(III-29)
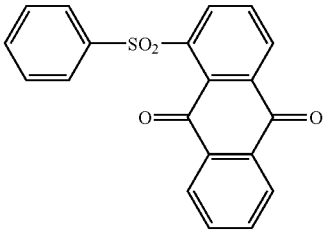
(III-30)
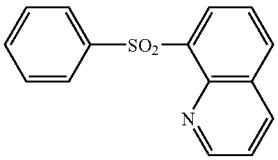
(III-31)
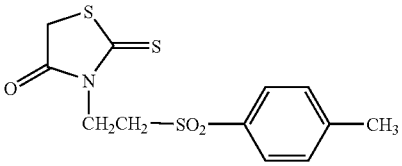
(III-32)
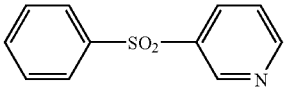
(III-33)
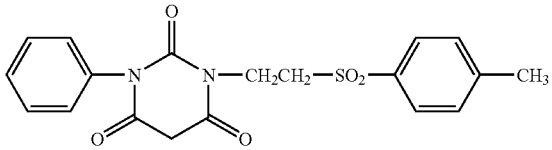
(III-34)
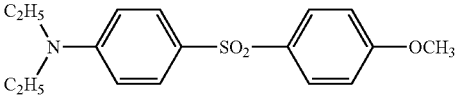
(III-35)
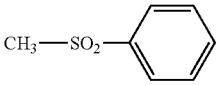
(III-36)
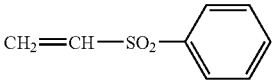
(III-37)
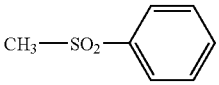
(III-38)
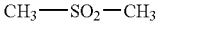
(III-39)
(III-40)
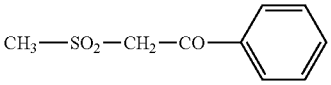

-continued (III-41)

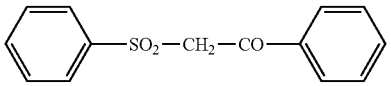

The positive photosensitive composition for use with an infrared laser, as the second object of the present invention, can contain any materials which can be used for forming the aforementioned photosensitive image-forming material described above as the first object. Materials, which is used preferably in the aforementioned photosensitive image-forming material, can be used preferably in the composition.

For example, the resin, which is used in the layer (A) or (B) of the photosensitive image-forming material of the present invention, may be used as an alkali-soluble resin for forming the positive photosensitive composition, and a preferable resin for the layer (A) and (B) is also preferable for the positive photosensitive composition. Accordingly, the resin having an acid group such as carboxyl group, resole type phenol resin or novolak type phenol resin are preferably used, and phenol resins described in Japanese Patent Application Laid-Open (JP-A) No. 61-217034 are also particularly preferably used.

These alkali-soluble resins preferably have the weight-average molecular weight in the range of from 500 to 200,000, and the number-average molecular weight in the range of from 200 to 60,000.

Such alkali-soluble resin may be used single or in combination thereof, and used in an amount of 5 to 99% by weight, preferably 10 to 95% by weight, and more preferably 20 to 90% by weight, based on all of the solid components of the layers of the printing plate material. When the amount of the alkali-soluble resin is less than 5% by weight, the durability of the recording layer deteriorates. On the other hand, when the amount exceeds 99% by weight of a recording layer, it is not preferable in view of the sensitivity and durability.

The weight-average molecular weight of the urethane polymers capable of using in the present invention is preferably not less than 2,000, more preferably in the range of from 5,000 to 300,000. The number-average molecular weight is preferably not less than 1,000, more preferably in the range of 2,000 to 250,000. Degree of molecular dispersion (weight-average molecular weight/number-average molecular weight) is preferably not less than 1, more preferably in the range of 1.1 to 10.

Unreacted monomers may be also contained in a binder capable of using in the present invention. In this case, the ratio of monomers in the binder is preferably not more than 15% by weight.

The alkali-soluble polymer specified above may be used single or mixing two or more is also preferable. Among them, mixing novolak resin with other binder and using is preferable.

In the present invention, various pigments or dyes, which can be used in the above photosensitive image forming material of the present invention, can be also used as materials which generates heat upon absorbing light in the positive photosensitive composition, and preferable one for them is also preferable for the composition. A method of dispersing pigments can be also used the same.

The particle diameter of a pigment is preferably in the range from 0.01 μm to 10 μm, more preferably in the range from 0.05 μm to 1 μm, and particularly preferably in the range from 0.1 μm to 1 μm. When the particle diameter of a pigment is less than 0.01 μm, it is not preferable in view of stability of a dispersed material in a photosensitive layer-coating solution. On the other hand, when the diameter exceeds 10 μm, it is not preferable in view of uniformity of the photosensitive layer.

Particularly preferred examples of dyes include near infrared-absorbing dyes represented by the formula (I) or (II) described in U.S. Pat. No. 4,756,993 Application.

These pigments or dyes can be added to a printing plate material in a rate of from 0.01 to 50% by weight, preferably from 0.1 to 10% by weight, based on all of the solid components of the layer (B), it is particularly preferably 0.5 to 10% by weight. In case of pigment, it is particularly preferably 3.1 to 10% by weight. When the amount of pigments or dyes is less than 0.01% by weight, the sensitivity is deteriorated. On the other hand, when the amount exceeds 50% by weight, the uniformity of the photosensitive layer is lost and durability of the recording layer is deteriorated.

These dyes or pigments may be added in the same layer with another components, and may be added in another layers which are formed for dyes or pigments. In latter case, it is preferable that the layer, which contain dyes or pigments, is laminated to a layer containing a heat decomposable material, which can be used in the present invention and substantially reduce solubility of resin in and non-decomposed state. Dyes or pigments and adhesive resin are preferably added to the same layer, but may be added to different layers.

Further, if necessary, various additives, as described in the above photosensitive image-forming material of the present invention, can be added in the positive photosensitive composition of the present invention. Preferable additive for them is also the same.

The amount to be added of o-quinonediazide compound is preferably in the range from 1 to 50% by weight, more preferably in the range from 5 to 30% by weight, and particularly 10 to 30% by weight, based on all of the solid components of the layers of the printing plate material. These compounds may be used single or in combination thereof.

The amount of the additives other than the o-quinonediazide compound is preferably within the range from 1 to 50% by weight, more preferably from 5 to 30% by weight, and particularly from 10 to 30% by weight based on all of the solid components of the layers of the printing plate material. The additives and binders in the present invention are preferably continued in the same layer.

Furthermore, the same cyclic acid anhydrides, phenols or organic acids, which can be used in the photosensitive image-forming material of the present invention, may be used in the positive photosensitive composition.

A rate of the above cyclic acid anhydrides, phenols and organic acids in the image-recording material is preferably 0.05 to 20% by weight, more preferably 0.1 to 15% by weight, and most preferably 0.1 to 10 by weight based on all of the solid components of the layers of the printing plate material.

Furthermore, the same non-ionic surfactant and ampholytic surfactant, which can used in the image-forming material, can be added in an image-recording material in order to extend stability of treatment to the developing condition.

A rate of the above non-ionic surfactant and ampholytic surfactant to the image-recording material is preferably 0.05 to 15% by weight, more preferably 0.1 to 5% by weight based on all of the solid components of the layers of the printing plate material. The printing out agents, for obtaining visible image immediately after heating by exposure to light, and dyes or pigments as a image-coloring agent can be added to the image-recording material wherein the printing out agents, dyes or pigments are the same in above image-forming material.

As a coloring agent of image, dyes besides the above salt-forming organic dyes can be used. Preferable dyes include salt-forming organic dyes as well as oil-soluble dyes and basic dyes. These dyes may be added to the image-recording material in a rate of 0.01 to 10% by weight, preferably 0.1 to 3% by weight, based on all of the solid components of the layers of the printing plate material.

Plasticizers may be further added, if necessary, to the image-recording material of the present invention, in order to impart flexibility of a film and the like. The plasticizers may be the same with the one can be used above photosensitive image-forming material of the present invention.

Appropriate image forming materials may be produced by the method that each components are dissolved in a solvent, and it is coated on a substrate. The solvent and the coating method may be the same with that of the above image-forming material, but it is not limited thereto.

These solvents are used single or in combination thereof. The concentration of the above component in a solvent (the all of the solids content containing an additive) is preferably from 1 to 50% by weight. The coating amount on the substrate(solid content) obtained after coating and drying varies depend on its use, but for a photosensitive printing plate, is generally preferably 0.5 to 5.0 g/m$^2$. As a coating method, various methods may be used.

A surfactant for improving coating properties may be used in the image-recording layer of the present invention as the case of the above image-forming material. The amount is preferably 0.01 to 1% by weight, more preferably 0.05 to 0.5% by weight, based on all of the solid components of the layers of the printing plate material.

Both the photosensitive positive image-forming material for use with an infrared laser and photosensitive composition of the present invention will be described in detail bellow.

A substrate which may be used in or with the present invention is a dimensionally-stable plate-like material. Examples thereof include paper, paper laminated with plastic (such as polyethylene, polypropylene, poly styrene and the like), a metal plate (such as aluminum, zinc, copper and the like), a plastic film (such as cellulose diacetate, cellulose triacetate, cellulose propionate, cellulose butyrate, cellulose acetate butyrate, cellulose nitrate, polyethyleneterephthalate, polyethylene, polystyrene, polypropylene, polycarbonate, polyvinyl acetal and the like), paper or a plastic film laminated or deposited with any one of the above metals.

A polyester film and an aluminum plate are preferable as a substrate in the present invention. Among them, an aluminum plate is particularly preferable because of its dimensional stability and low cost. Suitable aluminum plate is a pure aluminum plate and an alloy plate having aluminum as a main component and containing trace quantities of other elements. A plastic film laminated or deposited with aluminum may be used. Examples of the other elements contained in the aluminum alloy are silicon, iron, manganese, copper, magnesium, chromium, zinc, bismuth, nickel, titanium and the like. Content of the other elements in the alloy is at most 10% by weight. Particularly suitable aluminum is pure aluminum. However, since it is difficult to manufacture completely pure aluminum in view of refining techniques, trace quantities of other elements may be contained. As mentioned above, components of aluminum plate used in the present invention are not limited to specific ones. Aluminum plates which have been previously known and used can be arbitrarily used. The thickness of the aluminum plate used in the present invention is approximately 0.1 mm to 0.6 mm, preferably 0.15 mm to 0.4 mm, particularly preferably 0.2 mm to 0.3 mm.

Prior to roughening of the surface of an aluminum plate, a degreasing treatment is carried out using a surfactant, an organic solvent, an aqueous alkaline solution or the like in order to remove rolling oil from the surface of the aluminum plate, if necessary.

Roughening of the surface of the aluminum plate is carried out by various methods, for example, by a method using mechanical roughening, a roughening method of electrochemically dissolving the surface or a method of selectively dissolving the surface chemically. As a mechanical method, known methods such as ball abrasion, brush abrasion, air abrasion, buff abrasion and the like may be used. An electrochemical roughening method includes a method using alternating or direct current in a hydrochloric acid or nitric acid electrolysis solution. Alternatively, both methods can be performed through a combination thereof as disclosed in Japanese Patent Application Laid-Open (JP-A) No. 54-63902.

The aluminum plate thus roughened is subjected to an alkali etching treatment and neutralization treatment, if necessary and, thereafter, to anodization in order to enhance the water retention characteristics and abrasion resistance, as occasion demands. As electrolytes for anodizing the aluminum plate, various electrolytes which form a porous oxide layer can be employed. In general, sulfuric acid, phosphoric acid, oxalic acid, chromic acid or a mixed acid thereof are used. The concentration of the electrolyte is appropriately selected depending upon the kind of the electrolyte.

Conditions for anodizing treatment are not limited to specified ones since they vary with the kind of the electrolyte. Suitable conditions are in the range of concentration of the electrolyte of 1% to 80% by weight, temperature of the solution of 5 to 70° C., current density of 5 to 60 A/dm$^2$, voltage of 1 V to 100 V and an electrolysis time of 10 seconds to 5 minutes.

When an amount of an anodized oxide layer is less than 1.0 g/m$^2$, the plate wear resistance is insufficient and scratches are easily produced in a non-image part of the planographic printing plate and, thereby, so-called "tinting due to scratches" is easily Produced.

After the anodizing treatment, the surface of the aluminum plate is subjected to a process for imparting hydrophilicity thereto, if necessary. An example of such treatments includes a method using alkaline metal silicate (for example, aqueous solution of sodium silicate) as disclosed in U. S. Pat. Nos. 2,714,066, 3,181,461, 3,280,734 and 3,902,734. In this method, a support is treated by immersing in an aqueous solution of sodium silicate or treated through electrolysis. Other methods include a method of treatment of a support with potassium fluorozirconate as disclosed in Japanese Patent Application Publication (JP-B) No. 36-22063 or with polyvinylphosphonic acid as disclosed in U.S. Pat. Nos. 3,276,868, 4,153,461 and 4,689,272.

In the present invention, subbing layer may be applied before a photosensitive layer is coated on the substrate, it is preferable to provide subbing layer on the substrate, so as to decrease the amount of residual photosensitive layer in non-image areas.

An organic compound for use in the organic subbing layer is selected from the group consisting of carboxymethyl cellulose, dextrin, gum arabic, phosphonic acids such as 2-aminoethylphosphonic acid having an amino group, organic phosphonic acids such as phenylphosphonic acid which may have a substituent, naphthylphosphonic acid, alkylphosphonic acid, glycerophosphonic acid, methylenediphosphonic acid, and ethylenediphosphonic acid, organic phosphoric acids such as phenylphosphoric acid which may have a substituent, naphthylphosphoric acid, alkylphosphoric acid, and glycerophosphoric acid, organic phosphinic acids such as phenylphosphinic acid which may have a substituent, naphthylphosphinic acid, alkylphosphinic acid, and glycerophosphinic acid, amino acids such as glycine and β-alanine, hydrochloric acid salts of amines having a hydroxyl group such as triethanolamine These compounds may be used alone or in combinations thereof. Further, a polymer compound having a structural unit such as poly(p-vinylbenzoic acid) may also be used.

An organic subbing layer containing at least one compound selected from organic polymer compounds having structural units represented by the following general formula (XV) is also preferable.

(XV)

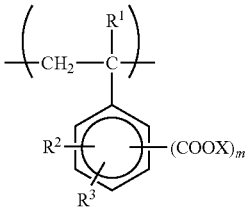

$R^1$ represents a hydrogen atom, a halogen atom or an alkyl group, $R^2$ and $R^3$represent independently a hydrogen atom, a halogen atom, an alkyl group, a substituted alkyl group, an aryl group, a substituted aryl group, —$OR^4$, —$COOR^5$, —$CONHR^6$, —$COR^7$ or —CN or $R^2$ and $R^3$ may bind to form a ring; $R^4$ to $R^7$ represents independently an alkyl group, an aryl group; X represents a hydrogen atom, a metal atom, $NR^8R^9R^{10}R^{11}$; R8 to R11 represents independently a hydrogen atom, an alkyl group, a substituted alkyl group, an aryl group or a substituted aryl group, or $R^8$ and $R^9$ may combined each other to form a ring; and m represents an integer of 1 to 3.

This organic subbing layer can be formed by a method as follows. That is, the above-mentioned organic compound is dissolved in water, an organic solvent such as methanol, ethanol or methyl ethyl ketone, or a mixture thereof to prepare a coating solution, and thereafter an aluminum plate is coated with the coating solution and dried, or the aluminum plate is immersed in the coating solution so that the organic compound is adsorbed on the surface of the aluminum plate to form a subbing layer which is then water-rinsed and dried. When the former method is employed, a solution containing 0.005 to 10% by weight of the organic compound can be applied by a variety of methods. When the latter method is employed, the parameters of the conditions are as follows: concentration of the solution is 0.01 to 20% by weight and preferably 0.05 to 5% by weight; immersion temperature is 20 to 90° C. and preferably 25 to 50° C.; and immersion time is 0.1 second to 20 minutes and preferably 2 seconds to 1 minute. The pH of the coating solution may be adjusted to from 1 to 12 by use of a base such as ammonia, triethylamine or potassium hydroxide or an acid such as hydrochloric acid or phosphoric acid. Further, a yellow dye may be incorporated into the coating solution so as to improve the reproducibility of the tune reproducibility of the image-forming material.

The desirable coated amount after drying of the organic subbing layer is in the range of from 2 to 200 mg/$m^2$and preferably in the range of from 5 to 100 mg/$m^2$. If the coated amount is less than 2 mg/$m^2$, a sufficient printing durability may not be obtained. On the other hand, if the coated amount exceeds 200 mg/$m^2$, the same undesirable results occur.

In the image-forming material of the invention, a protective layer may be provided on a photosensitive layer, if necessary. A protective component includes polyvinyl alcohol, mat materials used for a normal photosensitive image-forming material and the like.

In reverse side of the substrate, a back coat may be formed, if necessary. Preferred examples of the back coat are a coating layer obtained by an organic polymeric compound described in Japanese Patent Application Laid-Open (JP-A) No. 5-45,885 and a coating layer which comprises a metallic oxide and is obtained by hydrolyzing an organic or inorganic metallic compound and polycondensing the resulting product as described in Japanese Patent Application Laid-Open (JP-A) No. 6-35,174.

Among these coating layers, layers made from alkoxy compounds of silicon such as $Si(OCH_3)_4$, $Si(OC_2H_5)_4$, $Si(OC_3H_7)_4$ and $Si(OC_4H_9)_4$ are particularly preferable, because these compounds are inexpensive and the coating layers of metal oxides made from these compounds are excellent in resistance to developing solution.

The image-forming material produced as above is usually applied image-exposure to light and developing treatment.

Examples of a light source of active ray, which can be used for an image-exposure to light, includemercury lamp, metal halide lamp, xenon lamp, chemical lamp, carbonarc lamp and the like. Examples of a radiation include electron radiation, X-ray, ionbeam, far an infrared rays and the like. Further, g-ray, i-ray, Deep-UV light, high-density energy beam (laser beam) are also used. Examples of laser beam includes helium neon laser, argon laser, krypton laser, helium cadmium laser, KrFexyma laser and the like.

In the present invention, as a light source of active radiation used for image-exposure to light, a light source having illuminating wave length of 700 nm ore more is preferable, and solid laser, semi-solid laser are particularly preferable.

As a developer and replenisher, a known aqueous alkaline solution can be used for the present image recording material. Examples thereof are inorganic alkali salts such as sodium silicate, potassium silicate, sodium phosphate, potassium phosphate, ammonium phosphate, disodium hydrogen phosphate, dipotassium hydrogen phosphate, diammonium hydrogen phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylenimine, ethylenediamine, pyridine and the like are also used.

These alkali agents may be used alone or in combination of two or more of them.

Among developers containing these alkali agents, particularly preferable developers are an aqueous solution of a silicate such as sodium silicate, potassium silicate and the like. This is because the developing properties can be adjusted by changing the ratio and concentration of silicon oxide $SiO_2$ as a component of silicate and alkali metal oxide $M_2O$. For example, alkali metal silicates as described in Japanese Patent Application Laid-Open (JP-A) No. 54-62004, Japanese Patent Application Publication (JP-B) No. 57-7427 and the like are effectively used.

It has been known that, when development is carried out using an automatic developing machine, a large quantity of planographic printing plates can be processed without replacing a developer in a developing tank for a long period of time, by adding to the developer an aqueous solution having higher alkalinity (replenisher) than that of the developer. This replenishing method is preferably used in the present invention. In order to enhance or inhibit developing properties, or to improve scum dispersing properties formed in a developer and ink-affinity in an image part of a printing plate, various surfactants and organic solvents can be added to the developer and replenisher, if necessary. Examples of preferable surfactants are anionic, cationic, nonionic and amphoteric surfactants, Further, a reducing agent such as hydroquinone, resorcin, sodium or a potassium salt of an inorganic acid (such as sulfurous acid, hydrogen sulfurous acid and the like), and further, organic carboxylic acids, defoaming agents and hard water softeners may be added to the developer and replenisher, if necessary.

A printing plate which has been developed, by using the above developer and replenisher is post-treated with water, a rinse solution containing surfactants and the like, and a desensitizing solution containing gum arabic or a starch derivative. When the image recording material of the present invention is used as a printing plate for printing, a variety of combinations of the above described processings may be used for post-treatment.

Recently, an automatic processing machine has been widely used in plate making and printing industries in order to rational ize and standardize the plate making operation. In general, this automatic developing machine comprises a developing section and a post-treating section, and further comprises a device for conveying a printing plate, processing tanks and spraying devices. In such an automatic processing machine, developing processing is effected by spraying processing solution pumped up by pump from a spray nozzle to an exposed printing plate, while the printing plate is being horizontally conveyed. In addition, there has also been found recently a processing method in which a printing plate is immersed in a processing solution tank filled with the processing solution while the printing plate is conveyed by guide rolls in the processing solution. In such automatic processing, the printing plate can be processed while replenishing a replenisher to each processing solution depending upon the amount of the printing plate to be processed, working time and the like.

A so-called discarding-processing which does not use a replenisher can be applied to the present invention, where a printing plate is processed with a fresh processing solution which has not been substantially used.

The case of using the image-forming material of the present invention as a planographic printing plate will be described. When there is an unnecessary image part (for example, a trace of film edge of an original film and the like) on a planographic printing plate obtained by exposing image to light after developing and water-washing and/or rinsing and/or removing gum, an elimination of its unnecessary image part is conducted. As a method of the el iminat ion, a method such as described in Japanese Patent Application Publication (JP-B) No. 2-13293 wherein the elimination is conducted by coating an eliminating solution to an unnecessary image part and leaving for determined period and washing it by water, is preferable. However, amethod such as described in Japanese Patent Application Laid-Open (JP-A) No. 59-174842 wherein an active radiation led through optical fiber is irradiated to an unnecessary image part before development, can be utilized.

The planographic printing plate thus obtained can be subjected to a printing step, if desired, after being coated with desensitizing gum. When a planographic printing plate having a higher plate wear resistance is desired, the plate is subjected to a burning treatment.

When a planographic printing plate is subjected to a burning treatment, the plate is preferably treated with a counter-etching solution as described in Japanese Patent Application Publication (JP-B) Nos. 61-2518, 55-28062, Japanese Patent Application Laid-Open (JP-A) Nos. 62-31859 and 61-159655.

Such a treatment includes a method of coating a counter-etching solution on the plate using a sponge or an absorbent cotton impregnated with the counter-etching solution, or coating a counter-etching solution on the plate by immersing the plate in a tray filled with the counter-etching solution, and a method of coating the counter-etching solution using an automatic coater. Further, leveling of an amount using a squeegee or squeegee roller after coating gives better results.

In general, the amount of counter-etching solution to be applied is suitably 0.03 to 0.8 g/m$^2$ (dry weight).

The planographic printing plate coated with the counter-etching solution is dried, if necessary, and heated to an elevated temperature with a burning processor (such as burning processor: BP-1300, commercially available from Fuji Photo Film Co., Ltd.). The heating temperature and duration are preferably in the range of 180° C. to 300° C. and 1 to 20 minutes, respectively, depending on the kind of components forming the image.

The burning-treated planographic printing plate may be subjected to known treatments, such as washing with water, gum coating and the like, if necessary. When a counter-etching solution containing a water-soluble polymer and the like is used, a so-called desensitizing treatment such as gum coating and the like can be omitted.

The pregraphic printing plate obtained by such a treatment is mounted to an offset printing press and used to print a lot of copies.

The photosensitive composition and the image-forming material of the present invention respectively can express excellent properties. Furthermore, when they are used in combination thereof, they can express very excellent properties. Further, it is preferable for the solution containing the positive photosensitive composition to coat on the substrate and dry by device such a it of FIG. 1.

EXAMPLES

The present invention will next be described in detail by way of examples, which should not be construed as limiting the invention.

Synthesis Example of Copolymer 1

Methacrylic acid (31.0 g, 0.36 mol), ethyl chloroformate (39.1 g, 0.36 mol) and 200 ml of acetonitrile were placed in a 500 ml three-necked flask equipped with a stirrer, a cooling tube and a dropping funnel, and the mixture was stirred with cooling in an ice water bath. To this mixture, triethylamine (36.4 g, 0.36 mol) was added dropwise through the dropping funnel over about 1 hour. After the completion of the addition, the ice water bath was removed, and the mixture was stirred for 30 minutes at room temperature.

To this reaction mixture, p-aminobenzenesulfonamide (51.7 g, 0.30 mol) was added and the mixture was stirred with heating in an oil bath at 70° C. for 1 hour. After the completion of the reaction, this mixture was poured into 1 liter of water with stirring and the resulting mixture was stirred for 30 minutes. This mixture was filtered and the deposit was isolated. This deposit was poured into 500 ml of water to form a slurry and this slurry was filtered. Then, the resulting solid was dried to obtain N-(p-aminosulfonylphenyl)methacrylamide as a white solid (yield: 46.9 g).

Then, N-(p-aminosulfonylphenyl)methacrylamide (5.04 g, 0.021 mol), ethyl methacrylate (2.05 g, 0.0180 mol), acrylonitrile (1.11 g, 0.021 mol) and 20 g of N,N-dimethylacetamide were placed in a 100 ml three-necked flask equipped with a stirrer, a cooling tube and a dropping funnel, and the mixture was stirred with heating in a hot water bath at 65° C. To this mixture, 0.15 g of "V-65" (manufactured by Wako Pure Pharmaceutical Co., Ltd.) was added and the mixture was stirred with maintaining at 65° C. under a nitrogen stream for 2 hours. To this reaction mixture, a mixture of 5.04 g of N-(p-aminosulfonylphenyl) methacrylamide, 2.05 g of ethyl methacrylate, 1.11 g of acrylonitrile, 20 g of N,N-dimethylacetamide and 0.15 g of "V-65" was further added dropwise through a dropping funnel over 2 hours. After the completion of the dropwise addition, the resulting mixture was further stirred at 65° C. for 2 hours. After the completion of the reaction, 40 g of methanol was added to the mixture. After cooling, the resulting mixture was poured into 2 liter of water with stirring and the mixture was stirred for 30 minutes. The deposit was isolated by filtration and dried to obtain 15 g of a white solid. The weight-average molecular weight (polystyrene standard) of this copolymer was measured by gel permeation chromatography. As a result, it was 53,000.

Synthesis Example of Copolymer 2.

According to the same manner as that described in Synthesis Example 1 except for changing N-(p-aminosulfonylphenyl)methacrylamide (5.04 g, 0.0210 mol) to N-(p-hydroxyphenyl)methacrylamide (3.72 g, 0.0210 mol) in the polymerization reaction of Synthesis Example 1, the polymerization reaction was performed to obtain a copolymer 2 having a weight-average molecular weight (polystyrene standard) of 47,000.

Production of Substrate.

After an aluminum plate (type 1050) having a thickness of 0.30 mm was washed with trichloroethylene to degrease it, the plate surface was sand-blasted using a nylong brush and an aqueous suspension of 400 mesh Pamiston and washed well with water. This plate was immersed in a 25% aqueous solution of sodium hydroxide at 45° C. for 9 seconds to etch it, washed with water, immersed in 2% $HNO_3$ for 20 seconds and again washed with water. At this point, the etched amount of the sand-blasted surface was about 3 g/m$^2$. Then, after 3 g/m$^2$ of a direct current-anodized oxide film was formed on this plate using 7% $H_2SO_4$ as an electrolysis solution at a current density of 15 A/dm$^2$, the plate was washed with water and dried to form a substrate A. Then, the following subbing solution was coated on this aluminum plate and dried at 80° C. for 30 seconds to form a substrate B. The coated amount after drying was 10 mg/m$^2$.

Subbing Solution

| | |
|---|---|
| β-alanine | 0.5 g |
| Methanol | 95 g |
| Pure water | 5 g |

Example 1

The following photosensitive solution A1 was coated on the resulting substrate B and dried at 100° C. for 2 minutes to form a layer (A). The Coated Amount after Drying Was 1.4 g/m$^2$.

Then, the following photosensitive solution B1 was coated thereon and dried at 100° C. for 2 minutes to form a layer (B), and a planographic printing plate was obtained. The total coated amount of the photosensitive solution after drying was 2.0 g/m$^2$.

Photosensitive Solution A1

| | |
|---|---|
| Copolymer 1 | 0.75 g |
| Cyanine dye A | 0.04 g |
| p-toluenesulfonic acid | 0.002 g |
| Tetrahydrophthalic anhydride | 0.05 g |

A dye prepared by using 1-naphthalenesulfonic anion as pair anion of Victoria Pure Blue BOH 0.015 g

| | |
|---|---|
| Fluoro type surfactant (Megafack F-177 manufactured by Dainippon Ink & Chemicals, Inc.) | 0.02 g |
| γ-butyllactone | 8 g |
| Methyl ethyl ketone | 7 g |
| 1-metoxy-2-propanol | 7 g |

Photosensitive Solution B1

| | |
|---|---|
| m,p-cresol novolak (m/p ratio: 6/4, weight-average molecular weight: 4000) | 0.25 g |
| Cyanine dye A | 0.05 g |
| n-dodecyl stearate | 0.05 g |
| Fluoro type surfactant (Megafack F-177 manufactured by Dainippon Ink & Chemicals, Inc.) | 0.02 g |
| Methyl ethyl ketone | 7 g |
| 1-metoxy-2-propanol | 7 g |

Example 2

The following photosensitive solution A2 was coated on the resulting substrate B and dried at 100° C. for 2 minutes to form a layer (A). The Coated Amount After Drying Was 1.5 g/m$^2$.

Then, the following photosensitive solution B2 was coated thereon and dried by the following method. That is, immediately after coating, a high-pressure air (3000 mmAq) was blown to the coating through a slit nozzle 12 and, at the same time, heating at 130° C. was performed by a heating roll, wherein a guide roll 14 was changed to a heating roll, in the drying zone shown in FIG. 1, and a layer (B) was formed, thereby a planographic printing plate was obtained. The total coated amount of the photosensitive solution after drying was 2.0 g/m$^2$.

Photosensitive Solution A2

| | |
|---|---|
| m,p-cresol novolak (m/p ratio: 6/4, weight-average molecular weight: 4000) | 0.75 g |
| Copolymer 2 | 0.10 g |
| Cyanine dye B | 0.3 g |
| 2,6-bishydroxymethyl-p-cresol | 0.02 g |
| p-toluenesulfonic acid | 0.005 g |
| Tetrahydrophthalic anhydride | 0.01 g |

A dye prepared by using 1-naphthalenesulfonic anion as pair anion of Victoria Pure Blue BOH 0.015 g

| | |
|---|---|
| Fluoro type surfactant (Megafack F-177 manufactured by Dainippon Ink & Chemicals, Inc.) | 0.02 g |
| Methyl ethyl ketone | 12 g |
| 1-metoxy-2-propanol | 10 g |

Photosensitive Solution B2

| | |
|---|---|
| m,p-cresol novolak (m/p ratio: 6/4, weight-average molecular weight: 4000) | 0.25 g |
| Cyanine dye B | 0.07 g |
| n-dodecyl stearate | 0.05 g |
| Fluoro type surfactant (Megafack F-177 manufactured by Dainippon Ink & Chemicals, Inc.) | 0.05 g |
| Methyl ethyl ketone | 7 g |
| 1-metoxy-2-propanol | 7 g |

Comparative Example 1

Only the photosensitive solution A1 used in Example 1 was coated on the resulting substrate B and dried at 100° C. for 2 minutes to form a photosensitive layer, thereby obtaining a planographic printing plate. The coated amount after drying was 1.4 g/m$^2$.

Comparative Example 2

A photosensitive solution was prepared by use of a p-cresol novolak (m/p ratio: 6/4, weight-average molecular weight: 4000) instead of the copolymer 1 of the photosensitive solution A1 used in Example 1. It was coated on the resulting substrate B and dried at 100° C. for 2 minutes to form a photosensitive layer, thereby obtaining a planographic printing plate. The coated amount after drying was 1.4 g/m$^2$.

(Evaluation of Planographic Printing Plate)

The planographic printing plates of Examples 1, 2 and Comparative Examples 1, 2 obtained as described above, were performed the evaluation according to the following criteria. These results are shown in Table 1.

(Sensitivity and Latitude)

The resulting planographic printing plates were exposed to infrared rays having a wavelength of 830 nm emitted from a semiconductor laser which have an output of 500 mW and a beam diameter of 17 μm (1/e2) at a principal scanning rate of 5 m/second. After exposure, the plates were processed through an automatic developing machine filled with a developer, DP-4, and a rinse solution, FR-3 (1:7), (manufactured by Fuji Photo Film Co., Ltd.). In that case, two developers prepared respectively by diluting in a dilution ratio of 1:8 and 1:6 were used, and each line width of the resulting non-image areas was measured. Then, each irradiation energy corresponding to the line width was determined and was taken as the sensitivity. A difference in sensitivity between the cases of diluting in a dilution ratio of 1:8 and 1:6 was recorded. The smaller the difference, the better the development latitude. When the development latitude is not more than 20 mJ/cm$^2$, it is a level enough to put in practice.

(Plate Wear Resistance)

The planographic printing plates processed with DP-4 (1:8) were subjected to printing on awoodfree paper by the use of a Heidel KOR-D machine manufactured by Heidelberg Co. Printing was performed with wiping off the plate surface with a cleaner solution (Plate Cleaner CL2 manufactured by Fuji Photo Film Co., Ltd.) every 5,000 copies. The total number of copies is shown in Table 1. The total number of copies means the number of copies attained until so-called washed-out print occurs, that is, the photosensitive layer of the planographic printing plate causes a reduction in film thickness and ink is not applied partially.

TABLE 1

| | Sensitivity (mJ/cm$^2$) | | Development latitude | Number of copies (×10$^4$ copies) |
|---|---|---|---|---|
| | DP-4 (1:8) | DP-4 (1:6) | (1:8)-(1:6) | |
| Example 1 | 150 | 140 | 10 | 5.0 |
| Example 2 | 150 | 140 | 10 | 4.5 |
| Comparative example 1 | 140 | 80 | 60 | 4.0 |
| Comparative example 2 | 150 | 90 | 60 | 1.50 |

As is apparent from Table 1, the planographic printing plate which has a double-layer structure photosensitive layer comprising a layer (A) and a layer (B) according to the present invention is superior in development latitude and plate wear resistance to Comparative Examples 1, 2, and further is also superior in sensitivity. On the other hand, the comparative examples having a photosensitive layer composed only of the layer (A) are inferior in development latitude and, particularly, Comparative Example 2 using no copolymer containing a specific monomer of the present invention is inferior in plate wear resistance.

Accordingly, the photosensitive image-forming material for use with an infrared laser of the present invention can improve a poor image-forming property wherein an aqueous alkali solution-soluble polymer compound is used in a recording layer. Further the photosensitive image-forming material can be suitably used as a photosensitive image-forming material which is free from limitation of the place to handle, and which has excellent plate wear resistance, stability of stability to the concentration of a developing solution, that is, good development latitude and excellent plate wear resistance, at high sensitivity.

Synthesis Example of Copolymer 3

Methacrylic acid (31.0 g, 0.36 mol), ethyl chloroformate (39.1 g, 0.36 mol) and 200 ml of acetonitrile were placed in a 500 ml three-necked flask equipped with a stirrer, a cooling tube and a dropping funnel, and the mixture was stirredwith cooling in an ice water bath. To this mixture, triethylamine (36.4 g, 0.36 mol) was added dropwise through the dropping funnel over about 1 hour. After the completion of the dropwise addition, the ice water bath was removed and the mixture was stirred at room temperature for 30 minutes.

To this reaction mixture, p-aminobenzenesulfonamide (51.7 g, 0.30 mol) was added and the mixture was stirred with heating in an oil bath at 70° C. for 1 hour. After the completion of the reaction, this mixture was poured into 1 liter of water with stirring and the resulting mixture was stirred for 30 minutes. This mixture was filtered and the deposit was isolated. This deposit was poured into 500 ml of water to form a slurry and this slurry was filtered. Then, the resulting solid was dried to obtain N-(p-aminosulfonylphenyl)methacrylamide as a white solid (yield: 46.9 g).

Then, N-(p-aminosulfonylphenyl)methacrylamide (4.61 g, 0.0192 mol), ethyl methacrylate (2.94 g, 0.0258 mol), acrylonitrile (0.80 g, 0.015 mol) and 20 g of N,N-dimethylacetamide were placed in a 20 ml three-necked flask equipped with a stirrer, a cooling tube and a dropping funnel, and the mixture was stirred with heating in a hot water bath at 65° C. To this mixture, 0.15 g of "V-65" (manufactured by Wako Pure Pharmaceutical Co., Ltd.) was added and the mixture was stirred with maintaining at 65° C. under a nitrogen stream for 2 hours. To this reaction mixture, a mixture of 4.61 g of N-(p-aminosulfonylphenyl) methacrylamide, 2.94 g of ethyl methacrylate, 0.80 g of acetonitrile, 20 g of N,N-dimethylacetamide and 0.15 g of "V-65" was further added dropwise through a dropping funnel over 2 hours. After the completion of the dropwise addition, the resulting mixture was further stirred at 65° C. for 2 hours. After the completion of the reaction, 40 g of methanol was added to the mixture. After cooling, the resulting mixture was poured into 2 liter of water with stirring and the mixture was stirred for 30 minutes. The deposit was isolated by filtration and dried to obtain 15 g of a white solid. The weight-average molecular weight (polystyrene standard) of this polymer compound was measured by gel permeation chromatography. As a result, it was 53,000.

Synthesis Example 4 of Copolymer

Acrylic acid (25.9 g, 0.36 mol), ethyl chloroformate (39.1 g, 0.36 mol) and 200 ml of acetonitrile were placed in a 500 ml three-necked flask equipped with a stirrer, a cooling tube and a dropping funnel, and the mixture was stirred with cooling in an ice water bath. To this mixture, triethylamine (36.4 g, 0.36 mol) was added dropwise through the dropping funnel over about 1 hour. After the completion of the dropwise addition, the ice water bath was removed and the mixture was stirred at room temperature for 30 minutes.

To this reaction mixture, p-aminobenzenesulfonamide (51.7 g, 0.30 mol) was added and the mixture was stirred with heating in an oil bath at 70° C. for 1 hour. After the completion of the reaction, this mixture was poured into 1 liter of water with stirring and the resulting mixture was stirred for 30 minutes. This mixture was filtered and the deposit was isolated. This deposit was poured into 500 ml of water to form a slurry and this slurry was filtered. Then, the resulting solid was dried to obtain N-(p-aminosulfonylphenyl)methacrylamide as a white solid (yield: 42.3 g).

Then, N-(p-aminosulfonylphenyl) acrylamide (5.08 g, 0.0224 mol), methyl methacrylate (1.96 g, 0.020 mol), aacrylonitrile (0.96 g, 0.018 mol) and 20 g of N,N-dimethylacetamide were placed in a 20 ml three-necked flask equipped with a stirrer, a cooling tube and a dropping funnel, and the mixture was stirred with heating in a hot water bath at 65° C. To this mixture, 0.15 g of "V-65" (manufactured by Wako Pure Pharmaceutical Co., Ltd.) was added and the mixture was stirred with maintaining at 65° C. under a nitrogen stream for 2 hours. To this reaction mixture, a mixture of 5.08 g of N-(p-aminosulfonylphenyl) acrylamide, 1.96 g of methyl methacrylate, 0.96 g of acrylonitrile, 20 g of N,N-dimethylacetamide and 0.15 g of "V-65" was further added dropwise through a dropping funnel over 2 hours. After the completion of the dropwise addition, the resulting mixture was further stirred at 65° C. for 2 hours. After the completion of the reaction, 40 g of methanol was added to the mixture. After cooling, the resulting mixture was poured into 2 liter of water with stirring and the mixture was stirred for 30 minutes. The deposit was isolated by filtration and dried to obtain 15 g of a white solid. The weight-average molecular weight (polystyrene standard) of this polymer compound was measured by gel permeation chromatography. As a result, it was 47,000.

Synthesis Example of Copolymer 5

N-(p-toluenesulfonyl)methacrylamide (8.6 g, 0.036 mol), methyl methacrylate (1.20 g, 0.012 mol), acrylonitrile (0.64 g, 0.012 mol) and 20 g of N,N-dimethylacetamide were placed in a 20 ml three-necked flask equipped with a stirrer, a cooling tube and a dropping funnel, and the mixture was stirred with heating in a hot water bath at 65° C. To this mixture, 0.15 g of "V-65" (manufactured by Wako Pure Pharmaceutical Co., Ltd.) was added and the mixture was stirred with maintaining at 65° C. under a nitrogen stream for 2 hours. To this reaction mixture, a mixture of 8.6 g of N-(p-toluenesulfonyl)methacrylamide, 1.20 g of methyl methacrylate, 0.64 g of acrylonitrile, 20 g of N,N-dimethylacetamide and 0.15 g of "V-65" was further added dropwise through a dropping funnel over 2 hours. After the completion of the dropwise addition, the resulting mixture was further stirred at 65° C. for 2 hours. After the completion of the reaction, 40 g of methanol was added to the mixture. After cooling, the resulting mixture was poured into 2 liter of water with stirring and the mixture was stirred for 30 minutes. The deposit was isolated by filtration and dried to obtain 15 g of a white solid. The weight-average molecular weight (polystyrene standard) of this polymer compound was measured by gel permeation chromatography. As a result, it was 55,000.

Examples 3–6

According to the same manner as that described above, a substrate A was produced and the substrate A was processed with an aqueous 2.5% (by weight) sodium silicate solution at 30° C. for 10 seconds. Then, the following subbing solution which contain polymer represented by the following general formulas (XVI) or (XVII) was coated thereon and dried at 80° C. for 15 seconds to form a substrate C.

The coated amount after drying was 15 mg/m$^2$.

Subbing Solution

| | |
|---|---|
| Polymer having a molecular weight of 28,000 represented by the general formulas (XVI) or (XVII) | 0.3 g |
| Methanol | 100 g |
| Pure water | 1 g |

Each of the following photosensitive solutions 1–4 was coated on the resulting substrate B so that the coated amount is 1.8 g/m$^2$ to obtain planographic printing plates B1–B4.

General formula (XVI)

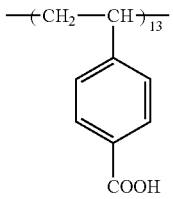

General formula (XVII)

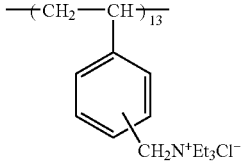

Photosensitive Solution 1

| | |
|---|---|
| Copolymer 3 | 0.7 g |
| m,p-cresol novolak (m/p ratio: 6/4, weight-average molecular weight: 3500, containing 0.5% by weight of unreacted cresol) | 0.3 g |
| Sulfone compound (III-1) | 0.3 g |
| p-toluenesulfonic acid | 0.003 g |
| Tetrahydrophthalic anhydride | 0.03 g |
| Cyanine dye F | 0.017 g |

A dye prepared by using 1-naphthalenesulfonic anion as pair anion of Victoria Pure Blue BOH 0.015 g

| | |
|---|---|
| Megafack F-177 (manufactured by Dainippon Ink & Chemicals, Inc., fluoro type surfactant) | 0.05 g |
| γ-butyllactone | 2 g |
| Methyl ethyl ketone | 20 g |
| 1-metoxy-2-propanol | 1 g |

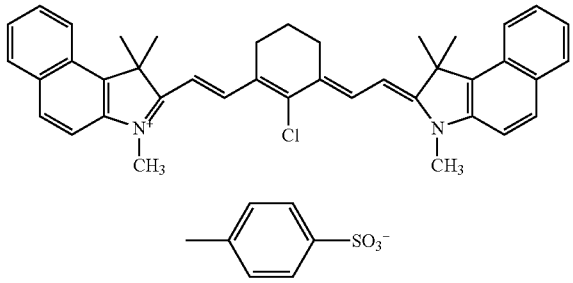

Cyanine dye F

| | |
|---|---|
| Copolymer 4 | 0.3 g |
| m,p-cresol novolak (m/p ratio: 6/4, weight-average molecular weight: 3500, containing 0.5% by weight of unreacted cresol) | 0.7 g |
| Sulfone compound (III-4) | 0.26 g |
| p-toluenesulfonic acid | 0.003 g |
| Tetrahydrophthalic anhydride | 0.03 g |
| Cyanine dye G | 0.015 g |

A dye prepared by using 1-naphthalenesulfonic anion as pair anion of Ethyl Violet (manufactured by Orient Chemical Industry Co., Ltd.) 0.015 g

| | |
|---|---|
| Megafack F-177 (manufactured by Dainippon Ink & Chemicals, Inc., fluoro type surfactant) | 0.05 g |
| γ-butyllactone | 2 g |
| Methyl ethyl ketone | 20 g |
| 1-metoxy-2-propanol | 1 g |

-continued

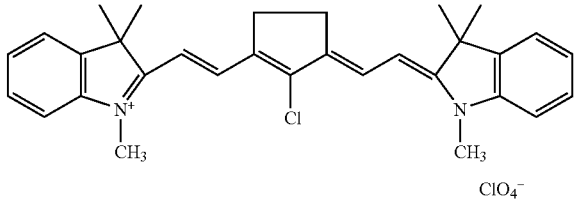

Cyanine dye G

| | |
|---|---|
| Copolymer 5 | 0.9 g |
| m,p-cresol novolak (m/p ratio: 6/4, weight-average molecular weight: 3500, containing 0.5% by weight of unreacted cresol) containing 0.5% by weight of unreacted cresol) | 0.1 g |
| Sulfone compound (III-14) | 0.16 g |
| p-toluenesulfonic acid | 0.003 g |
| Tetrahydrophthalic anhydride | 0.03 g |
| Cyanine dye H | 0.008 g |

A dye prepared by using 1-naphthalenesulfonic anion as pair anion of Victoria Pure Blue 0.015 g

| | |
|---|---|
| Megafack F-177 (manufactured by Dainippon Ink & Chemicals, Inc., fluoro type surfactant) | 0.05 g |
| γ-butyllactone | 2 g |
| Methyl ethyl ketone | 20 g |
| 1-metoxy-2-propanol | 1 g |

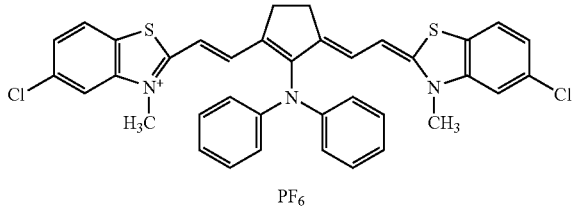

Cyanine dye H

| | |
|---|---|
| Copolymer of benzyl methacrylate and methacrylic acid (molar ratio: 72:28, weight-average molecular weight: 70000) | 0.9 g |
| p-cresol/pheno;/formaldehyde novolak resin (p-cresol/phenol = 5/5, weight-average molecular weight: 3500, containing 0.5% by weight of unreacted cresol) | 0.1 g |
| Disulfone compound (II-3) | 0.05 g |
| p-toluenesulfonic acid | 0.003 g |
| Tetrahydrophthalic anhydride | 0.03 g |
| Cyanine dye I | 0.017 g |
| 4-(p-Hydroxybenzoylaminophenyl)-2,6-bis(trichloromethyl)-a-triazine | 0.01 g |

A dye prepared by using 1-naphthalenesulfonic anion as pair anion of Victoria Pure Blue 0.015 g

| | |
|---|---|
| Megafack F-177 (manufactured by Dainippon Ink & Chemicals, Inc., fluoro type surfactant) | 0.05 g |
| γ-butyllactone | 2 g |
| Methyl ethyl ketone | 20 g |
| 1-metoxy-2-propanol | 1 g |

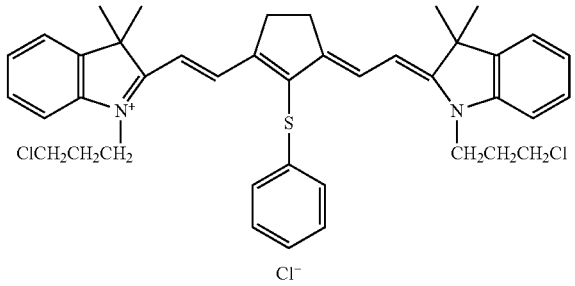

Cyanine dye I

Comparative Example 3 and 4

The following photosensitive solutions 5 and 6 were respectively coated on the substrate B so that the coated amount is 1.8 g/m$^2$, and obtained planographic printing plates B5 and B6.

Photosensitive Solution 5

| | |
|---|---|
| Polymer compound 1 | 0.7 g |
| m,p-cresol novolak (m/p ratio: 6/4, weight-average molecular weight: 3500, containing 0.5% by weight of unreacted cresol) | 0.3 g |
| p-toluenesulfonic acid | 0.003 g |
| Tetrahydrophthalic anhydride | 0.03 g |
| Cyanine dye F | 0.017 g |
| A dye prepared by using 1-naphthalenesulfonic anion as pair anion of Victoria Pure Blue | 0.015 g |
| Megafack F-177 (manufactured by Dainippon Ink & Chemicals, Inc., fluoro type surfactant) | 0.05 g |
| γ-butyllactone | 2 g |
| Methyl ethyl ketone | 20 g |
| 1-metoxy-2-propanol | 1 g |

| | |
|---|---|
| Ester of naphthoquinone-1,2-Diazide-5-sulfonyl chloride and pyrogallol-acetone resin (described in Example 1 of U.S. Pat. No. 3,635,709) | 0.45 g |
| Copolymer of N-(p-aminosulfonylphenyl) methacrylamide with methyl methacrylate (described in Synthesis Example 1 of EP-A2-330, 239) | 1.10 g |
| 2-(p-Methoxyphenyl)-4,5-bis (trichloromethyl)-g-triazine | 0.02 g |
| Oil Blue #603 (manufactured by Orient Chemical Industry Co., Ltd.) | 0.01 g |
| 2,6-Di-t-butyl-4-[5-(2,5-di-t-butyl-4H-thiopyran-4-ylidene)-penta-1,3-dienyl)thiopyrylium tetrafluoroborate (compound described in U.S. Pat. No. 4,283,475) | 0.01422 g |
| Megafack F-177 (manufactured by Dainippon Ink & Chemicals, Inc., fluoro type surfactant) | 0.06 g |

-continued

| | |
|---|---|
| Methyl ethyl ketone | 10 g |
| Methyl cellosolve | 10 g |

The resulting planographic plates B-1 to B-4 of the present invention and planographic printing plates B-5 and B-6 of the comparative examples were exposed and developed in the same manner as that described above. In that case, two developers prepared respectively by diluting in a dilution ratio of 1:8 and 1:12 were used, and an exposure amount, wherein it is required to form an image using each developer, was measured. Then, a difference of the exposure amount was recorded(development latitude). The smaller the numerical value shown in the table 2, the better the development latitude. When the development latitude is not more than 20 mJ/cm$^2$, it is a level enough to put in practice.

TABLE 2

| | Planographic printing plates | Substrate | Coated photosensitive solution | Sensitivity (mJ/cm$^2$) DP-4 (1/8) | Sensitivity (mJ/cm$^2$) DP-4 (1/12) | Development latitude (mJ/cm$^2$) |
|---|---|---|---|---|---|---|
| Example 3 | B-1 | B | 1 | 160 | 160 | 0 |
| Example 4 | B-2 | B | 2 | 170 | 170 | 0 |
| Example 5 | B-3 | B | 3 | 140 | 160 | 20 |
| Example 6 | B-4 | B | 4 | 180 | 180 | 0 |
| Comparative example 3 | B-5 | B | 5 | 180 | Poor development | — |
| Comparative example 4 | B-6 | B | 6 | 200 | Poor development | — |

As is apparent from Table 2, the planographic printing plates B-1 to B-4 using a disulfon or sulfone compound are superior in development latitude to the planographic printing plates B-5 and B-6, and are in a level enough to put in practice.

(Examples 7–10, Comparative Examples 5–6)

According to the same manner as that described in Examples 7–10 and Comparatives Examples 5–6 except for changing the substrate B to the substrate C, planographic printing plates C-1 to C-6 were obtained, respectively.

The resulting planographic printing plates C-1 to C-14 of the present invention and planographic printing plates C-5 and C-6 of the comparative examples were exposed to infrared rays having a wavelength of 830 nm, emitted from a semiconductor laser having an output of 500 mW and a beam diameter of 17 μm (1/e 2) at a principal scanning rate of 5 m/second. After exposure, the plates were processed through a PS processor 900 VR (manufactured by Fuji Photo Film Co., Ltd.) filled with two kinds of developer having a different dilution rate of the following composition (developer 1, developer 2), and a rinse solution, FR-3 (diluted in a rate of 1:7). In that case, an exposure amount required for the formation of an image using each developer was measured. Then, a difference (development latitude) was recorded.

| | |
|---|---|
| D-sorbitol | 5.1 parts by weight |
| Sodium hydroxide | 1.1 parts by weight |

-continued

| | |
|---|---|
| Triethanolamine ethylene oxide adduct (30 mol) | 0.03 parts by weight |
| Pure water | 93.9 parts by weight |

Developer 2

| | |
|---|---|
| D-sorbitol | 5.1 parts by weight |
| Sodium hydroxide | 1.1 parts by weight |
| Triethanolamine ethylene oxide adduct (30 mol) | 0.03 parts by weight |
| Pure water | 140.7 parts by weight |

TABLE 3

| | Planographic printing plates | Substrate | Coated photosensitive solution | Sensitivity (mJ/cm²) Developer 1 | Sensitivity (mJ/cm²) Developer 2 | Development latitude (mJ/cm²) |
|---|---|---|---|---|---|---|
| Example 7 | C-1 | C | 1 | 170 | 170 | 0 |
| Example 8 | C-2 | C | 2 | 180 | 190 | 10 |
| Example 9 | C-3 | C | 3 | 180 | 200 | 20 |
| Example 10 | C-4 | C | 4 | 180 | 180 | 0 |
| Comparative example 5 | C-5 | C | 5 | 140 | Poor development | — |
| Comparative example 6 | C-6 | C | 6 | 210 | Poor development | — |

As is apparent from Table 3, the planographic printing plates C-1 to C-4 using a disulfon or sulfone compound are superior in development latitude to the planographic printing plates C-5 and C-6 of the comparative examples.

What is claimed is:

1. A positive type photosensitive image-forming material for use with an infrared laser, comprising:

a substrate;

a layer (A) containing not less than 50% by weight of a copolymer which contains, as a copolymerization component, not less than 10% by mol of at least one of the following monomers (a-1) to (a-3):

(a-1) a monomer having in the molecule a sulfonamide group wherein at least one hydrogen atom is linked to a nitrogen atom, (a-2) a monomer having in the molecule an active imino group represented by the following general formula (I):

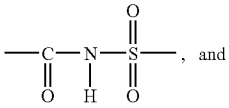

(I)

, and (a-3) a monomer selected from acrylamide, methacrylamide, acrylate, methacrylate and hydroxystyrene, which respectively have a phenolic hydroxyl group; and a layer (B) containing not less than 50% by weight of an aqueous alkali solution-soluble resin having a phenolic hydroxyl group, said layer (B) being laminated directly on said layer (A) formed on said substrate, wherein at least said layer (B) contains at least one compound which generates heat upon absorbing light.

2. A positive type photosensitive image-forming material for use with an infrared laser according to claim 1, wherein the monomer (a-1) is selected from low-molecular weight compounds having an acryloyl group, an allyl group or a vinyloxy group, and having a substituted or mono-substituted aminosulfonyl group or a substituted iminosulfonyl group.

3. A positive type photosensitive image-forming material for use with an infrared laser according to claim 1, wherein the monomer (a-2) is at least one compound selected from N-(p-toluenesulfonyl)methacrylamide and N-(p-toluenesulfonyl)acrylamide.

4. A positive type photosensitive image-forming material for use with an infrared laser according to claim 1, wherein the monomer (a-3) is at least one compound selected from N-(4-hydroxyphenyl)acrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene and p-hydroxystyrene.

5. A positive type photosensitive image-forming material for use with an infrared laser according to claim 1, wherein a coated amount of said layer (A) is in the range from 0.5 to 4.0 g/m².

6. A positive type photosensitive image-forming material for use with an infrared laser according to claim 1, wherein the copolymer contained in said layer (A) has a weight-average molecular weight of not less than 2000 and a number-average molecular weight of not less than 500.

7. A positive type photosensitive image-forming material for use with an infrared laser according to claim 1, wherein a degree of molecular dispersion (weight-average molecular weight/number-average molecular weight) of the copolymer contained in said layer (A) is from 1.1 to 10.

8. A positive type photosensitive image-forming material for use with an infrared laser according to claim 1, wherein a material, which is thermally decomposable and, in a [non-decomposable] *non-decomposed* state, is capable of substantially lowering the solubility of the *copolymer, which is an* aqueous alkali-soluble polymer compound, is used in combination with the copolymer as the composition forming the layer (A).

9. A positive type photosensitive image-forming material for use with an infrared laser according to claim 8, wherein the [substance] *material*, which is thermally decomposable and, in the [non-decomposable] *non-decomposed* state, is capable of substantially lowering the solubility of the aqueous alkali-soluble polymer compound, is selected from onium salt, quinonediazide compound, aromatic sulfone compound and aromatic sulfonate compound.

10. [Apositive] *A positive* type photosensitive image-forming material for use with an infrared laser according to claim 8, wherein the [substance] *material*, which is thermally decomposable and, in the [non-decomposable] *non-decomposed* state, is capable of substantially lowering the solubility of the aqueous alkali-soluble polymer compound, contains at least one of [compound a] compound (II) or (III) represented by the following formula:

$$R^1—SO_2—SO_2—R^2 \quad (II)$$

$$R^1—SO_2—R^2 \quad (III)$$

wherein $R^1$ and $R^2$ may be the same or different, and $R^1$ and $R^2$ each represent a substituted or non-substituted alkyl, alkenyl or aryl group.

11. A positive type photosensitive image-forming material for use with an infrared laser according to claim 1, wherein the resin contained in said layer (B) has a weight-average molecular weight of from 500 to 20000 and a number-average molecular weight of from 200 to 10000.

12. A positive type photosensitive image-forming material for use with an infrared laser according to claim 1, wherein the compound which generates heat upon absorbing light contained in said layer (B) is selected from the group consisting of [the] pigments [or the] *and* dyes.

13. A positive type photosensitive image-forming material for use with an infrared laser according to claim 1, wherein the aqueous alkali solution-soluble resin having a phenolic hydroxyl group contained in said layer (B) is *a novalak resin* selected from [novolak resins such as] *the group consisting of* phenol formaldehyde resin, m-cresol formaldehyde resin, p-cresol formaldehyde resin, m-/p-mixed cresol formaldehyde resin, and phenol/cresol [(any of m-, p- or m-/p-mixed)] mixed formaldehyde resin *comprising at least one of m-cresol formaldehyde resin, p-cresol formaldehyde resin, and m-/p-mixed cresol formaldehyde resin.*

14. A positive type photosensitive image-forming material for use with an infrared laser according to claim 1, wherein said substrate is made of a polyester film or an aluminum plate.

15. A positive type photosensitive image-forming material for use with an infrared laser according to claim 1, wherein the compound which generates heat upon absorbing light has a light absorption region in the infrared region of 700 nm or more, and exhibits the ability to convert light to heat under light of a wavelength within this region.

16. A positive type photosensitive image-forming material for use with an infrared laser according to claim 1, wherein a light source to be used is one of a solid state laser and semiconductor.

17. A positive type photosensitive image-forming material for use with an infrared laser according to claim 1, wherein said layer (A) and said layer (B) are infrared sensitive.

18. A positive type photosensitive image-forming material for use with an infrared laser according to claim 1, wherein said material can be exposed to white light and thereafter remain useful as an image-forming material.

19. A positive type photosensitive image-forming material for use with an infrared laser, comprising:

a substrate;

a layer (A) containing not less than 50% by weight of a copolymer which contains, as a copolymerization component, not less than 10% by mol of at least one of the following monomers (a-1) to (a-3):

(a-1) a monomer having in the molecule a sulfonamide group wherein at least one hydrogen atom is linked to a nitrogen atom, (a-2) a monomer having in the molecule an active imino group represented by the following general formula (I):

(I)

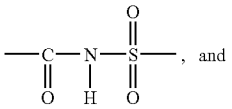

, and (a-3) a monomer selected from acrylamide, methacrylamide, acrylate, methacrylate and hydroxystyrene, which respectively have a phenolic hydroxyl group; and a layer (B) containing not less than 50% by weight of an aqueous alkali solution-soluble resin having a phenolic hydroxyl group, said layer (B) being formed directly on said layer (A), wherein at least said layer (B) contains at least one compound which generates heat upon absorbing light.

20. A positive type photosensitive image-forming material for use with an infrared laser, comprising:

a substrate;

a layer (A) containing not less than 50% by weight of a copolymer which contains, as a copolymerization component, not less than 10% by mol of at least one of the following monomers (a-1) to (a-3):

(a-1) a monomer having in the molecule a sulfonamide group wherein at least one hydrogen atom is linked to a nitrogen atom, (a-2) a monomer having in the molecule an active imino group represented by the following general formula (I):

(I)

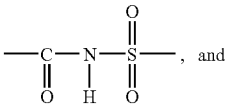

, and (a-3) a monomer selected from acrylamide, methacrylamide, acrylate, methacrylate and hydroxystyrene, which respectively have a phenolic hydroxyl group; and a layer (B) containing not less than 50% by weight of an aqueous alkali solution-soluble resin having a phenolic hydroxyl group, said layer (A) and said layer (B) being laminated on said substrate in that order, wherein at least said layer (B) contains at least one compound which generates heat upon absorbing light, and wherein said material can be [exosed] *exposed* to white light and thereafter remain useful as an image-forming material.

*21. A positive-type photosensitive image-forming material for use with an infrared laser according to claim 17, wherein the compound which generates heat upon absorbing light contained in said layer (B) is selected from the group consisting of pigments and dyes; and wherein said layer (A) further comprises a material, which is thermally decomposable and, in a non-decomposed state, is capable of substantially lowering the solubility of the copolymer in the layer (A), said copolymer being an aqueous alkali-soluble polymer compound.*

*22. A positive-type photosensitive image-forming material for use with an infrared laser according to claim 21, wherein the aqueous alkali solution-soluble resin of layer (B) is soluble in a solvent which does not dissolve the copolymer of layer (A).*

*23. A positive-type photosensitive image-forming material for use with an infrared laser according to claim 21, wherein at least one of layers (A) and (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*24. A positive-type photosensitive image-forming material for use with an infrared laser according to claim 23, wherein said oil-soluble dye or basic dye is selected from the group consisting of Victoria Pure Blue, Crystal Violet, Methyl Violet, and Ethyl Violet.*

*25. A positive-type photosensitive image-forming material for use with an infrared laser according to claim 21, wherein*

*said material which generates heat upon absorbing light in layer (B) is an infrared-absorbing dye compound.*

*26. A positive-type photosensitive image-forming material for use with an infrared laser according to claim 25, wherein said infrared-absorbing dye compound in layer (B) is a cyanine dye compound.*

*27. A positive-type photosensitive image-forming material for use with an infrared laser according to claim 26, wherein said cyanine dye compound in layer (B) is represented by formula (XII):*

(XII)

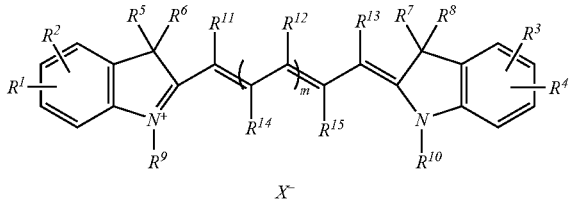

*wherein:*

- *$R^1$ to $R^4$ each independently represents an alkyl group, an alkenyl group, an alkoxy group, a cycloalkyl group or an aryl group, each having from 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group; and $R^1$ and $R^2$, $R^3$ and $R^4$ may be linked to form a ring;*
- *$R^5$ to $R^{10}$ each independently represents an alkyl group having 1 to 12 carbon atoms or an aryl group having 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group;*
- *$R^{11}$ to $R^{13}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{12}$ may be linked to $R^{11}$ or $R^{13}$ to form a ring; m is an integer of 1 to 8, and when m is 2 or more, plural $R^{12}$ groups, which may be the same or different, may be linked to form a ring;*
- *$R^{14}$ and $R^{15}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{14}$ may be linked to $R^{15}$ to form a ring; m is an integer of 1 to 8, and when m is 2 or more, plural $R^{14}$ groups, which may be the same or different, may be linked to form a ring; and*
- *$X^-$ represents an anion.*

*28. A positive-type photosensitive image-forming material for use with an infrared laser according to claim 27, wherein said cyanine dye compound in layer (B) is cyanine dye A represented by the following formula:*

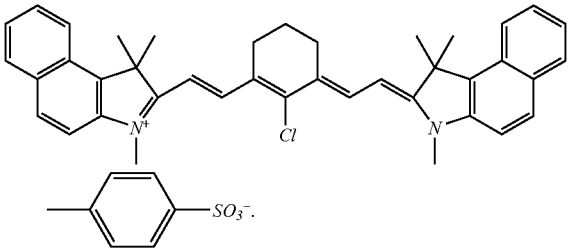

*29. A positive-type photosensitive image-forming material for use with an infrared laser according to claim 27, wherein the aqueous alkali solution-soluble resin of layer (B) is soluble in a solvent which does not dissolve the copolymer of layer (A).*

*30. A positive-type photosensitive image-forming material for use with an infrared laser according to claim 27, wherein at least one of layers (A) and (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*31. A positive-type photosensitive image-forming material for use with an infrared laser according to claim 30, wherein said oil-soluble dye or basic dye is selected from the group consisting of Victoria Pure Blue, Crystal Violet, Methyl Violet, and Ethyl Violet.*

*32. A positive-type photosensitive image-forming material for use with an infrared laser according to claim 21, wherein said infrared-sensitive layer (A) contains an infrared-absorbing dye compound.*

*33. A positive-type photosensitive image-forming material for use with an infrared laser according to claim 32, wherein said infrared-absorbing dye compound in layer (A) is a cyanine dye compound.*

*34. A positive-type photosensitive image-forming material for use with an infrared laser according to claim 33, wherein said cyanine dye compound in layer (A) is represented by formula (XII):*

(XII)

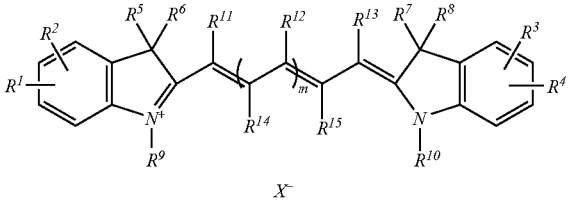

*wherein:*

- *$R^1$ to $R^4$ each independently represents an alkyl group, an alkenyl group, an alkoxy group, a cycloalkyl group or an aryl group, each having from 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group; and $R^1$ and $R^2$, $R^3$ and $R^4$ may be linked to form a ring;*
- *$R^5$ to $R^{10}$ each independently represents an alkyl group having 1 to 12 carbon atoms or an aryl group having 1 to 12 carbon atoms, each of which is unsubstituted or* substituted with a halogen atom, a carbonyl group, a nitro group, a nitryl group, a sulfonyl group, a carboxyl group, a carboxylate group, or a sulfonate group;

$R^{11}$ to $R^{13}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{12}$ may be linked to $R^{11}$ or $R^{13}$ to form a ring; m is an integer of 1 to 8, and when m is 2 or more, plural $R^{12}$ groups, which may be the same or different, may be linked to form a ring;

$R^{14}$ and $R^{15}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{14}$ may be linked to $R^{15}$ to form a ring; m is an integer of 1 to 8, and when m is 2 or more, plural $R^{14}$ groups, which may be the same or different, may be linked to form a ring; and $X^-$ represents an anion.

35. A positive-type photosensitive image-forming material for use with an infrared laser according to claim 34, wherein said cyanine dye compound in layer (B) is cyanine dye A represented by the following formula:

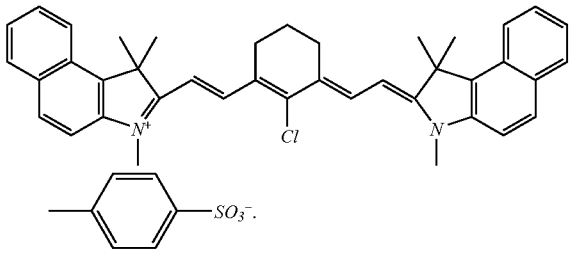

36. A positive-type photosensitive image-forming material for use with an infrared laser according to claim 34, wherein the aqueous alkali solution-soluble resin of layer (B) is soluble in a solvent which does not dissolve the copolymer of layer (A).

37. A positive-type photosensitive image-forming material for use with an infrared laser according to claim 34, wherein at least one of layers (A) and (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

38. A positive-type photosensitive image-forming material for use with an infrared laser according to claim 37, wherein said oil-soluble dye or basic dye is selected from the group consisting of Victoria Pure Blue, Crystal Violet, Methyl Violet, and Ethyl Violet.

39. A positive-type photosensitive image-forming material for use with an infrared laser according to claim 21, wherein said substrate comprises a polyester film or an aluminum plate.

40. A positive-type photosensitive image-forming material for use with an infrared laser according to any one of claims 21-39, wherein the aqueous alkali solution-soluble resin having a phenolic hydroxyl group contained in said layer (B) is a novolak resin.

41. A positive-type photosensitive image-forming material for use with an infrared laser according to claim 40, wherein the novolak resin is selected from the group consisting of phenol formaldehyde resin, m-cresol formaldehyde resin, p-cresol formaldehyde resin, m-/p-mixed cresol formaldehyde resin, and phenol/cresol mixed formaldehyde resin comprising at least one of m-cresol formaldehyde resin, p-cresol formaldehyde resin, and m-/p-mixed cresol formaldehyde resin.

42. A positive-type photosensitive image-forming material for use with an infrared laser according to claim 40, wherein the material, which is thermally decomposable and, in the non-decomposed state, is capable of substantially lowering the solubility of the aqueous alkali-soluble polymer compound, is contained in at least layer (A) and is selected from onium salt, quinonediazide compound, aromatic sulfone compound, and aromatic sulfonate compound.

43. A positive-type photosensitive image-forming material for use with an infrared laser according to claim 42, wherein the material, which is thermally decomposable and, in the non-decomposed state, is capable of substantially lowering the solubility of the aqueous alkali-soluble polymer compound, is an ammonium salt.

44. A positive-type photosensitive image-forming material for use with an infrared laser according to claim 40, wherein at least layer (A) contains an oil-soluble dye or basic dye which is capable of substantially lowering the solubility of the aqueous alkali-soluble polymer compound and is selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

45. A positive-type photosensitive image-forming material for use with an infrared laser according to claim 44, wherein said oil-soluble dye or basic dye is selected from the group consisting of Victoria Pure Blue, Crystal Violet, Methyl Violet, and Ethyl Violet.

46. A positive-type photosensitive image-forming material for use with an infrared laser according to claim 1, wherein said substrate comprises an aluminum plate, wherein in layer (A) the copolymer comprises monomer (a-1), and layer (A) further contains a cyanine dye and an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue, and wherein in layer (B) the aqueous alkali solution-soluble resin is a novolak resin, and layer (B) further contains a cyanine dye and at least one onium salt.

47. A positive-type photosensitive image-forming material for use with an infrared laser according to claim 46, wherein said oil-soluble dye or basic dye is selected from the group consisting of Victoria Pure Blue, Crystal Violet, Methyl Violet, and Ethyl Violet.

48. A positive-type photosensitive image-forming material for use with an infrared laser according to claim 46, wherein in layers (A) and (B) the cyanine dye is cyanine dye A represented by the following formula:

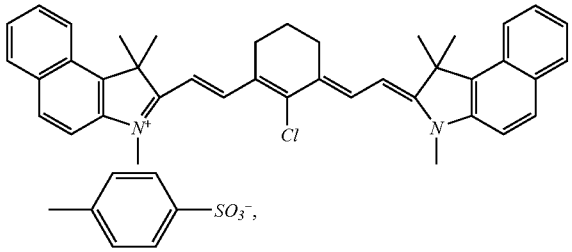

*the oil soluble dye or basic dye in layer (A) is Ethyl Violet, and*

*the onium salt in layer (B) is an ammonium salt.*

*49. A positive-type photosensitive image-forming material for use with an infrared laser, comprising:*

*a substrate;*

*a layer (A) containing not less than 50% by weight of an aqueous alkali-soluble polymer compound containing, as a polymerization component, 10% by mol or more of a monomer effective to improve plate wear resistance and sensitivity, and a material which generates heat upon absorbing light, and*

*a layer (B) containing not less than 50% by weight of an aqueous alkali solution-soluble resin having a phenolic hydroxyl group, said layer (B) being laminated directly on said layer (A) formed on said substrate,*

*wherein at least said layer (B) contains at least one infrared-absorbing dye compound which generates heat upon absorbing light.*

*50. A positive-type photosensitive image-forming material for use with an infrared laser according to claim 49, wherein the aqueous alkali solution-soluble resin of layer (B) is soluble in a solvent which does not dissolve the copolymer of layer (A).*

*51. A positive-type photosensitive image-forming material for use with an infrared laser according to claim 49, wherein layer (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*52. A positive-type photosensitive image-forming material for use with an infrared laser according to claim 51, wherein said oil-soluble dye or basic dye is selected from the group consisting of Victoria Pure Blue, Crystal Violet, Methyl Violet, and Ethyl Violet.*

*53. A positive-type photosensitive image-forming material for use with an infrared laser according to claim 49, wherein said layer (A) and said layer (B) are infrared-sensitive.*

*54. A positive-type photosensitive image-forming material for use with an infrared laser according to claim 53, wherein said material which generates heat upon absorbing light in layer (A) is an infrared-absorbing dye compound.*

*55. A positive-type photosensitive image-forming material for use with an infrared laser according to claim 54, wherein the aqueous alkali solution-soluble resin of layer (B) is soluble in a solvent which does not dissolve the copolymer of layer (A).*

*56. A positive-type photosensitive image-forming material for use with an infrared laser according to claim 54, wherein layer (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*57. A positive-type photosensitive image-forming material for use with an infrared laser according to claim 56, wherein said oil-soluble dye or basic dye is selected from the group consisting of Victoria Pure Blue, Crystal Violet, Methyl Violet, and Ethyl Violet.*

*58. A positive-type photosensitive image-forming material for use with an infrared laser according to claim 54, wherein said infrared-absorbing dye compound in layer (A) is a cyanine dye compound.*

*59. A positive-type photosensitive image-forming material for use with an infrared laser according to claim 58, wherein said cyanine dye compound in layer (A) is represented by formula (XII):*

*(XII)*

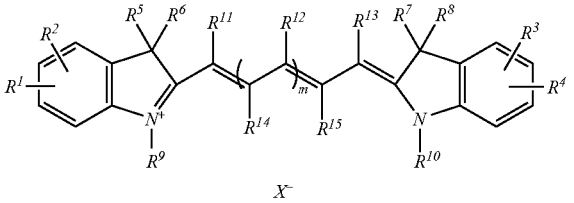

*wherein:*

*$R^1$ to $R^4$ each independently represents an alkyl group, an alkenyl group, an alkoxy group, a cycloalkyl group or an aryl group, each having from 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group; and $R^1$ and $R^2$, $R^3$ and $R^4$ may be linked to form a ring;*

*$R^5$ to $R^{10}$ each independently represents an alkyl group having 1 to 12 carbon atoms or an aryl group having 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group;*

*$R^{11}$ to $R^{13}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{12}$ may be linked to $R^{11}$ or $R^{13}$ to form a ring; m is an integer of 1 to 8, and when m is 2 or more, plural $R^{12}$ groups, which may be the same or different, may be linked to form a ring;*

*$R^{14}$ and $R^{15}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{14}$ may be linked to $R^{15}$ to form a ring; m is an integer of 1 to 8, and when m is 2 or more, plural $R^{14}$ groups, which may be the same or different, may be linked to form a ring; and*

*$X^-$ represents an anion.*

*60. A positive-type photosensitive image-forming material for use with an infrared laser according to claim 59, wherein* said cyanine dye compound in layer (A) is cyanine dye A represented by the following formula:

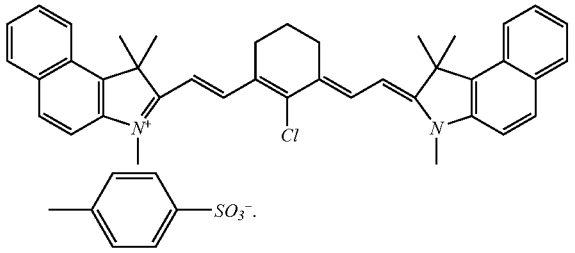

61. A positive-type photosensitive image-forming material for use with an infrared laser according to claim 59, wherein the aqueous alkali solution-soluble resin of layer (B) is soluble in a solvent which does not dissolve the copolymer of layer (A).

62. A positive-type photosensitive image-forming material for use with an infrared laser according to claim 59, wherein layer (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

63. A positive-type photosensitive image-forming material for use with an infrared laser according to claim 62, wherein said oil-soluble dye or basic dye is selected from the group consisting of Victoria Pure Blue, Crystal Violet, Methyl Violet, and Ethyl Violet.

64. A positive-type photosensitive image-forming material for use with an infrared laser according to claim 54, wherein said infrared-absorbing dye compounds in layers (A) and (B) are cyanine dye compounds.

65. A positive-type photosensitive image-forming material for use with an infrared laser according to claim 64, wherein said cyanine dye compounds are represented by formula (XII):

(XII)

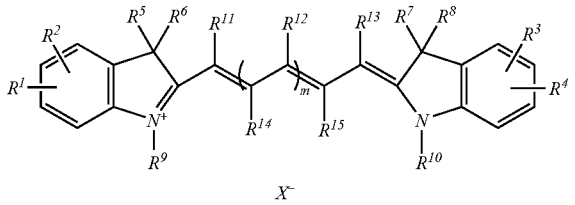

wherein:

$R^1$ to $R^4$ each independently represents an alkyl group, an alkenyl group, an alkoxy group, a cycloalkyl group or an aryl group, each having from 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group; and $R^1$ and $R^2$, $R^3$ and $R^4$ may be linked to form a ring;

$R^5$ to $R^{10}$ each independently represents an alkyl group having 1 to 12 carbon atoms or an aryl group having 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group;

$R^{11}$ to $R^{13}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{12}$ may be linked to $R^{11}$ or $R^{13}$ to form a ring; m is an integer of 1 to 8, and when m is 2 or more, plural $R^{12}$ groups, which may be the same or different, may be linked to form a ring;

$R^{14}$ and $R^{15}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{14}$ may be linked to $R^{15}$ to form a ring; m is an integer of 1 to 8, and when m is 2 or more, plural $R^{14}$ groups, which may be the same or different, may be linked to form a ring; and $X^-$ represents an anion.

66. A positive-type photosensitive image-forming material for use with an infrared laser according to claim 65, wherein said cyanine dye compound in layer (B) is cyanine dye A represented by the following formula:

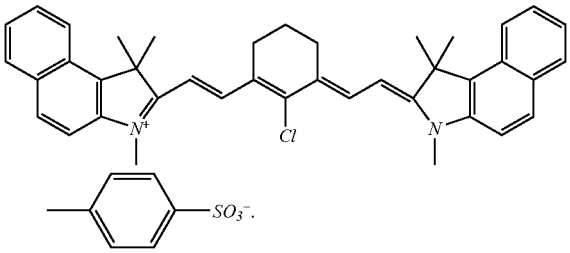

67. A positive-type photosensitive image-forming material for use with an infrared laser according to claim 65, wherein the aqueous alkali solution-soluble resin of layer (B) is soluble in a solvent which does not dissolve the copolymer of layer (A).

68. A positive-type photosensitive image-forming material for use with an infrared laser according to claim 65, wherein at least one of layers (A) and (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

69. A positive-type photosensitive image-forming material for use with an infrared laser according to claim 68, wherein said oil-soluble dye or basic dye is selected from the group consisting of Victoria Pure Blue, Crystal Violet, Methyl Violet, and Ethyl Violet.

70. A positive-type photosensitive image-forming material for use with an infrared laser according to claim 49, wherein said infrared-absorbing dye compound in layer (B) is a cyanine dye compound.

71. A positive-type photosensitive image-forming material for use with an infrared laser according to claim 70, wherein said cyanine dye compound in layer (B) is represented by formula (XII):

(XII)

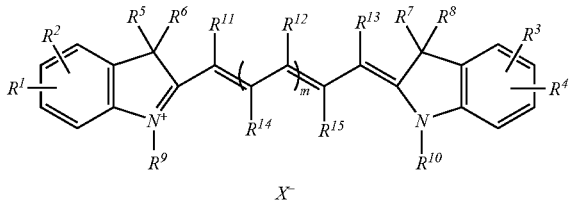

wherein:

$R^1$ to $R^4$ each independently represents an alkyl group, an alkenyl group, an alkoxy group, a cycloalkyl group or an aryl group, each having from 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group; and $R^1$ and $R^2$, $R^3$ and $R^4$ may be linked to form a ring;

$R^5$ to $R^{10}$ each independently represents an alkyl group having 1 to 12 carbon atoms or an aryl group having 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group;

$R^{11}$ to $R^{13}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{12}$ may be linked to $R^{11}$ or $R^{13}$ to form a ring; m is an integer of 1 to 8, and when m is 2 or more, plural $R^{12}$ groups, which may be the same or different, may be linked to form a ring;

$R^{14}$ and $R^{15}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{14}$ may be linked to $R^{15}$ to form a ring; m is an integer of 1 to 8, and when m is 2 or more, plural $R^{14}$ groups, which may be the same or different, may be linked to form a ring; and $X^-$ represents an anion.

72. A positive-type photosensitive image-forming material for use with an infrared laser according to claim 71, wherein said cyanine dye compound in layer (B) is cyanine dye A represented by the following formula:

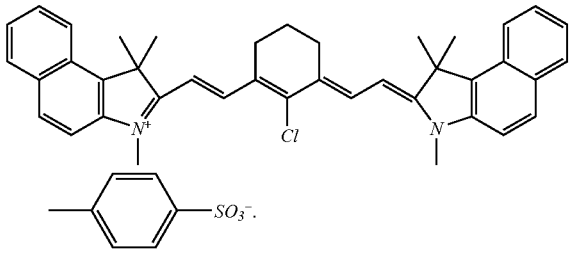

73. A positive-type photosensitive image-forming material for use with an infrared laser according to claim 71, wherein the aqueous alkali solution-soluble resin of layer (B) is soluble in a solvent which does not dissolve the copolymer of layer (A).

74. A positive-type photosensitive image-forming material for use with an infrared laser according to claim 71, wherein layer (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

75. A positive-type photosensitive image-forming material for use with an infrared laser according to claim 74, wherein said oil-soluble dye or basic dye is selected from the group consisting of Victoria Pure Blue, Crystal Violet, Methyl Violet, and Ethyl Violet.

76. A positive-type photosensitive image-forming material for use with an infrared laser according to claim 49, wherein said substrate comprises a polyester film or an aluminum plate.

77. A positive-type photosensitive image-forming material for use with an infrared laser according to any one of claims 49-76 and 79-82, wherein the aqueous alkali solution-soluble resin having a phenolic hydroxyl group contained in said layer (B) is a novolak resin.

78. A positive-type photosensitive image-forming material for use with an infrared laser according to claim 77, wherein the novolak resin is selected from the group consisting of phenol formaldehyde resin, m-cresol formaldehyde rein, p-cresol formaldehyde resin, m-/p-mixed cresol formaldehyde resin, and phenol/cresol mixed formaldehyde resin comprising at least one of m-cresol formaldehyde resin, p-cresol formaldehyde resin, and m-/p-mixed cresol formaldehyde resin.

79. A positive-type photosensitive image-forming material for use with an infrared laser, comprising:

a substrate;

a layer (A) containing not less than 50% by weight of an aqueous alkali-soluble polymer compound, and a material which generates heat upon absorbing light; and a layer (B) containing not less than 50% by weight of an aqueous alkali solution-soluble resin having a phenolic hydroxyl group, said layer (B) being laminated directly on said layer (A) formed on said substrate, wherein at least said layer (B) contains at least one infrared-absorbing dye compound which generates heat upon absorbing light, and wherein said aqueous alkali-soluble polymer compound is a copolymer which contains, as a copolymerization component, not less than 10% by mol of at least one of the following monomers (a-1) to (a-3):

(a-1) a monomer having in the molecule a sulfonamide group wherein at least one hydrogen atom is linked to a nitrogen atom, (a-2) a monomer having in the molecule an active imino group represented by the following general formula (I):

(I)

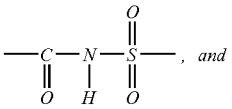

, and (a-3) a monomer selected from acrylamide, methacrylamide, acrylate, methacrylate and hydroxystyrene, which respectively have a phenolic hydroxyl group.

80. A positive-type photosensitive image-forming material for use with an infrared laser according to claim 79, wherein

*the aqueous alkali solution-soluble resin of layer (B) is soluble in a solvent which does not dissolve the copolymer of layer (A).*

*81. A positive-type photosensitive image-forming material for use with an infrared laser according to claim 79, wherein layer (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*82. A positive-type photosensitive image-forming material for use with an infrared laser according to claim 81, wherein said oil-soluble dye or basic dye is selected from the group consisting of Victoria Pure Blue, Crystal Violet, Methyl Violet, and Ethyl Violet.*

*83. A positive-type photosensitive image-forming material for use with an infrared laser according to any one of claims 79-82, wherein layer (B) further contains a cyanine dye and at least one onium salt.*

*84. A positive type photosensitive image-forming material for use with an infrared laser according to claim 83, wherein the aqueous alkali solution-soluble resin having a phenolic hydroxyl group contained in said layer (B) is a novolak resin.*

*85. A photosensitive image-forming material for use with an infrared laser, comprising:*

*a substrate;*

*a layer (A) containing not less than 50% by weight of a copolymer which contains, as a copolymerization component, not less than 10% by mol of at least one of the following monomers (a-1) to (a-3):*

*(a-1) a monomer having in the molecule a sulfonamide group wherein at least one hydrogen atom is linked to a nitrogen atom,*

*(a-2) a monomer having in the molecule an active imino group represented by the following general formula (I):*

*(I)*

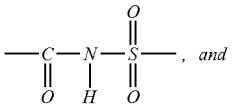

*, and*

*(a-3) a monomer selected from acrylamide, methacrylamide, acrylate, methacrylate and hydroxystyrene, which respectively have a phenolic hydroxyl group; and*

*a layer (B) containing not less than 50% by weight of an aqueous alkali solution-soluble resin having a phenolic hydroxyl group, said layer (B) being laminated directly on said layer (A) formed on said substrate, wherein at least said layer (B) contains at least one compound which generates heat upon absorbing light,*

*wherein the compound which generates heat upon absorbing light contained in said layer (B) is infrared-sensitive and selected from the group consisting of pigments and dyes,*

*wherein the image-forming material is a negative image-forming material, and*

*wherein the negative image-forming material further contains in at least one of layers (A) and (B) a material which crosslinks in the presence of an acid.*

*86. A photosensitive image-forming material for use with an infrared laser according to claim 85, wherein said layers (A) and (B) are infrared-sensitive.*

*87. A photosensitive image-forming material for use with an infrared laser according to claim 86, wherein the compound which generates heat upon absorbing light contained in said layer (B) is a cyanine dye compound.*

*88. A photosensitive image-forming material for use with an infrared laser according to claim 87, wherein layer (B) further contains an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*89. A photosensitive image-forming material for use with an infrared laser according to claim 88, wherein said oil-soluble dye or basic dye is selected from the group consisting of Victoria Pure Blue, Crystal Violet, Methyl Violet, and Ethyl Violet.*

*90. A photosensitive image-forming material for use with an infrared laser according to claim 88, wherein the aqueous alkali solution-soluble resin having a phenolic hydroxyl group contained in said layer (B) is a novolak resin.*

*91. A photosensitive image-forming material for use with an infrared laser according to claim 85, wherein the material which crosslinks in the presence of an acid is selected from the group consisting of (i) a compound having two or more hydroxymethyl groups or alkoxymethyl groups, epoxy groups or vinyl ether groups, which bond to a benzene ring, (ii) a compound having a N-hydroxymethyl group, N-alkoxymethyl group or N-acyloxymethyl group, and (iii) epoxy compounds.*

*92. A positive type photosensitive image-forming material for use with an infrared laser, comprising:*

*a substrate having thereon in this order:*

*a layer (A) containing not less than 50% by weight of a copolymer which contains, as a copolymerization component, 10% by mol or more of at least one monomer effective to improve plate wear resistance and sensitivity and at least one additional monomer selected from the group consisting of the following monomers (1) to (12):*

*(1) an acrylate or methacrylate having an aliphatic hydroxyl group,*

*(2) an alkyl acrylate,*

*(3) an alkyl methacrylate,*

*(4) an acrylamide or methacrylamide,*

*(5) a vinyl ether,*

*(6) a vinyl ester,*

*(7) a styrene,*

*(8) a vinyl ketone,*

*(9) an olefin,*

*(10) N-vinyl pyrrolidone, N-vinyl carbazole, 4-vinyl pyridine, acrylonitrile, or methacrylonitrile,*

*(11) an unsaturated imide, and*

*(12) an unsaturated carboxylic acid; and*

*a layer (B) containing not less than 50% by weight of a novolak resin,*

*wherein said layer (B) is laminated directly on said layer (A) formed on said substrate, and*

*wherein at least one of layer (A) and layer (B) comprises at least one compound which generates heat upon absorbing light.*

*93. A positive type photosensitive image-forming material for use with an infrared laser according to claim 92, wherein layer (B) comprises at least one compound which generates heat upon absorbing light.*

*94. A positive type photosensitive image-forming material for use with an infrared laser according to claim 92, wherein* at least one of layer (A) and layer (B) comprises an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

95. A positive-type photosensitive image-forming material for use with an infrared laser according to claim 94, wherein said oil-soluble dye or basic dye is selected from the group consisting of Victoria Pure Blue, Crystal Violet, Methyl Violet, and Ethyl Violet.

96. A positive type photosensitive image-forming material for use with an infrared laser, comprising:

a substrate having thereon in this order:

a layer (A) containing not less than 50% by weight of an aqueous alkali-soluble polymer containing, as a polymerization component, 10% by mol or more of a monomer effective to improve plate wear resistance and sensitivity; and a layer (B) containing not less than 50% by weight of an aqueous alkali solution-soluble resin having a phenolic hydroxyl group, wherein said layer (B) is laminated directly on said layer (A) formed on said substrate, and wherein at least one of the layer (A) and the layer (B) contains a compound which generates heat upon absorbing light that is represented by the formula (XII):

(XII)

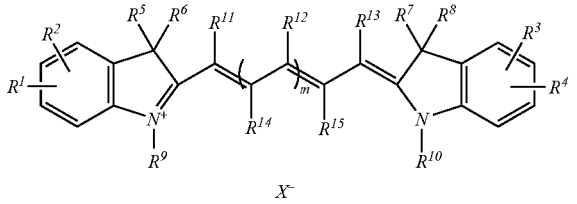

wherein:

$R^1$ to $R^4$ each independently represents an alkyl group, an alkenyl group, an alkoxy group, a cycloalkyl group or an aryl group, each having from 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group; and $R^1$ and $R^2$, $R^3$ and $R^4$ may be linked to form a ring;

$R^5$ to $R^{10}$ each independently represents an alkyl group having 1 to 12 carbon atoms or an aryl group having 1 to 12 carbon atoms, each of which is unsubstituted or substituted with a halogen atom, a carbonyl group, a nitro group, a nitryl group, a sulfonyl group, a carboxyl group, a carboxylate group, or a sulfonate group;

$R^{11}$ to $R^{13}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{12}$ may be linked to $R^{11}$ or $R^{13}$ to form a ring; m is an integer of 1 to 8, and when m is 2 or more, plural $R^{12}$ groups, which may be the same or different, may be linked to form a ring;

$R^{14}$ and $R^{15}$ each independently represents a hydrogen atom, a halogen atom or an alkyl group having 1 to 8 carbon atoms, each of which is unsubstituted or substituted with a halogen atom, a carbonyl group, a nitro group, a nitrile group, a sulfonyl group, a carboxyl group, a carboxylate group, or a sulfonate group; $R^{14}$ may be linked to $R^{15}$ to form a ring; m is an integer of 1 to 8, and when m is 2 or more, plural $R^{14}$ groups, which may be the same or different, may be linked to form a ring; and $X^-$ represents an anion.

97. A positive-type photosensitive image-forming material for use with an infrared laser according to claim 96, wherein said compound which generates heat upon absorbing light is present in layer (B) and is cyanine dye A represented by the following formula:

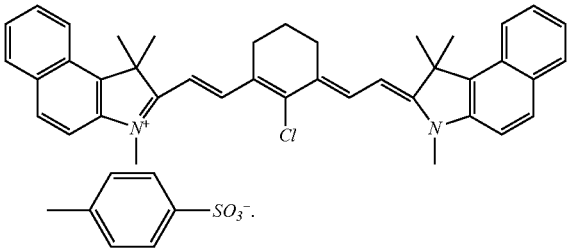

98. A positive type photosensitive image-forming material for use with an infrared laser according to claim 96, wherein said compound which generates heat upon absorbing light is present in layer (B).

99. A positive type photosensitive image-forming material for use with an infrared laser, comprising:

a substrate having thereon in this order:

a layer (A) containing not less than 50% by weight of an aqueous alkali-soluble polymer containing, as a polymerization component, 10% by mol or more of a monomer effective to improve plate wear resistance and sensitivity, and a layer (B) containing not less than 50% by weight of an aqueous alkali solution-soluble resin having a phenolic hydroxyl group, wherein the layer (B) contains a surfactant, wherein at least one of layer (A) and layer (B) comprises at least one compound which generates heat upon absorbing light, and wherein said layer (B) is laminated directly on said layer (A) formed on said substrate.

100. A positive type photosensitive image-forming material for use with an infrared laser according to claim 99, wherein layer (B) comprises at least one compound which generates heat upon absorbing light.

101. A positive type photosensitive image-forming material for use with an infrared laser according to claim 99, wherein at least one of layer (A) and layer (B) comprises an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.

102. A positive-type photosensitive image-forming material for use with an infrared laser according to claim 101, wherein said oil-soluble dye or basic dye is selected from the group consisting of Victoria Pure Blue, Crystal Violet, Methyl Violet, and Ethyl Violet.

103. A positive type photosensitive image-forming material for use with an infrared laser, comprising:

*a substrate having thereon in this order:*

*a layer (A) containing not less than 50% by weight of a copolymer which contains, as a copolymerization component, 10% by mol or more of at least one monomer effective to improve plate wear resistance and sensitivity and selected from an unsaturated imide, methacrylamide, and an unsaturated carboxylic acid; and*

*a layer (B) containing not less than 50% by weight of a novolak resin;*

*wherein said layer (A) comprises a cyanine dye and said layer (B) comprises an Ethyl Violet dye, and*

*wherein said layer (B) is laminated directly on said layer (A) formed on said substrate.*

*104. A positive type photosensitive image-forming material for use with an infrared laser according to claim 103, wherein said layer (B) further comprises a cyanine dye.*

*105. A positive type photosensitive image-forming material for use with an infrared laser, which is produced by a method comprising the steps of:*

*providing a substrate;*

*coating on the substrate a layer (A) containing not less than 50% by weight of an aqueous alkali-soluble polymer containing, as a polymerization component, 10% by mol or more of a monomer effective to improve plate wear resistance and sensitivity; and*

*coating a layer (B) containing not less than 50% by weight of an aqueous alkali solution-soluble resin having a phenolic hydroxyl group on the layer (A) using a solvent which does not dissolve the layer (A),*

*wherein at least one of layer (A) and layer (B) comprises at least one compound which generates heat upon absorbing light, and*

*wherein the layer (B) is laminated directly on the layer (A) formed on the substrate.*

*106. A positive type photosensitive image-forming material for use with an infrared laser according to claim 105, wherein layer (B) comprises at least one compound which generates heat upon absorbing light.*

*107. A positive type photosensitive image-forming material for use with an infrared laser according to claim 105, wherein at least one of layer (A) and layer (B) comprises an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*108. A positive-type photosensitive image-forming material for use with an infrared laser according to claim 107, wherein said oil-soluble dye or basic dye is selected from the group consisting of Victoria Pure Blue, Crystal Violet, Methyl Violet, and Ethyl Violet.*

*109. A positive type photosensitive image-forming material for use with an infrared laser, comprising:*

*a substrate having thereon in this order:*

*a layer (A) containing not less than 50% by weight of an aqueous alkali-soluble polymer containing, as a polymerization component, 10% by mol or more of a monomer effective to improve plate wear resistance and sensitivity; and*

*a layer (B) containing not less than 50% by weight of an aqueous alkali solution-soluble resin having a phenolic hydroxyl group;*

*wherein at least one of layer (A) and layer (B) comprises at least one compound which generates heat upon absorbing light,*

*wherein said layer (B) is laminated directly on said layer (A) formed on said substrate, and*

*wherein a coated amount of the layer (A) is from 1.4 to 4.0 g/m$^2$.*

*110. A positive type photosensitive image-forming material for use with an infrared laser according to claim 109, wherein layer (B) comprises at least one compound which generates heat upon absorbing light.*

*111. A positive type photosensitive image-forming material for use with an infrared laser according to claim 109, wherein at least one of layer (A) and layer (B) comprises an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*112. A positive-type photosensitive image-forming material for use with an infrared laser according to claim 111, wherein said oil-soluble dye or basic dye is selected from the group consisting of Victoria Pure Blue, Crystal Violet, Methyl Violet, and Ethyl Violet.*

*113. A positive type photosensitive image-forming material for use with an infrared laser, which is produced by a method comprising the steps of*

*providing a substrate,*

*coating on the substrate a layer (A) containing not less than 50% by weight of an aqueous alkali-soluble polymer containing, as a polymerization component, 10% by mol or more of a monomer effective to improve plate wear resistance and sensitivity,*

*coating a layer (B) containing not less than 50% by weight of an aqueous alkali solution-soluble resin having a phenolic hydroxyl group on the layer (A), and*

*drying the coated layer (B) by applying a high-pressure air flow or heat provided by a heating roll,*

*wherein at least one of layer (A) and layer (B) comprises at least one compound which generates heat upon absorbing light, and*

*wherein the layer (B) is laminated directly on the layer (A) formed on the substrate.*

*114. A positive type photosensitive image-forming material for use with an infrared laser according to claim 113, wherein layer (B) comprises at least one compound which generates heat upon absorbing light.*

*115. A positive type photosensitive image-forming material for use with an infrared laser according to claim 113, wherein at least one of layer (A) and layer (B) comprises an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*116. A positive-type photosensitive image-forming material for use with an infrared laser according to claim 115, wherein said oil-soluble dye or basic dye is selected from the group consisting of Victoria Pure Blue, Crystal Violet, Methyl Violet, and Ethyl Violet.*

*117. A positive-type photosensitive image-forming material for use with an infrared laser, comprising:*

*a substrate;*

*a layer (A) containing not less than 50% by weight of an aqueous alkali-soluble polymer compound containing, as a polymerization component, 10% by mol or more of a monomer effective to improve plate wear resistance*

*and sensitivity, and a material which generates heat upon absorbing light, and*

*a layer (B) containing not less than 50% by weight of an aqueous alkali solution-soluble resin having a phenolic hydroxyl group, said layer (B) being laminated directly on said layer (A) formed on said substrate.*

*118. A positive type photosensitive image-forming material for use with an infrared laser according to claim 117, wherein said layer (B) comprises at least one material which generates heat upon absorbing light.*

*119. A positive type photosensitive image-forming material for use with an infrared laser according to claim 117, wherein at least one of layer (A) and layer (B) comprises an oil-soluble dye or basic dye selected from the group consisting of Oil Yellow #101, Oil Yellow #103, Oil Pink #312, Oil Green BG, Oil Blue BOS, Oil Blue #603, Oil Black BY, Oil Black BS, Oil Black T-505, Victoria Pure Blue, Crystal Violet, Methyl Violet, Ethyl Violet, Rhodamine B, Malachite Green, and Methylene Blue.*

*120. A positive-type photosensitive image-forming material for use with an infrared laser according to claim 119, wherein said oil-soluble dye or basic dye is selected from the group consisting of Victoria Pure Blue, Crystal Violet, Methyl Violet, and Ethyl Violet.*

* * * * *